(12) United States Patent
Lu et al.

(10) Patent No.: US 12,213,369 B2
(45) Date of Patent: Jan. 28, 2025

(54) DISPLAY PANEL AND DISPLAY DEVICES WITH LIGHT DETECTION CIRCUITS

(71) Applicant: Shanghai Tianma Micro-Electronics Co., Ltd., Shanghai (CN)

(72) Inventors: Feng Lu, Shanghai (CN); Yang Zeng, Shanghai (CN); Yaodong Wu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/346,453

(22) Filed: Jul. 3, 2023

(65) Prior Publication Data

US 2023/0368568 A1    Nov. 16, 2023

(30) Foreign Application Priority Data

Mar. 9, 2023  (CN) .......................... 202310226565.0

(51) Int. Cl.
*H10K 59/60* (2023.01)
*G01J 1/04* (2006.01)
(Continued)

(52) U.S. Cl.
CPC ............ *H10K 59/60* (2023.02); *G01J 1/0488* (2013.01); *G01J 1/4204* (2013.01); *G01J 1/4228* (2013.01);
(Continued)

(58) Field of Classification Search
CPC ........ H10K 59/60; H10K 39/34; H10K 59/35; H10K 59/38; H10K 59/65; H10K 59/8792; G09G 3/32; G09G 2360/144; G01J 1/0488; G01J 1/4204; G01J 1/4228; G01J 1/44; G01J 2001/446; G06V 40/1318; G06V 40/1341
See application file for complete search history.

(56) References Cited

U.S. PATENT DOCUMENTS 11,562,686 B1 *   1/2023  Lu ............................. G09G 3/32
2007/0268206 A1 * 11/2007  Kinoshita ............... G06F 3/042
                                                          345/30

(Continued)

FOREIGN PATENT DOCUMENTS

CN       113702792 A  * 11/2021    ............... G09G 3/32

Primary Examiner — Jennifer D Bennett
(74) Attorney, Agent, or Firm — CHRISTENSEN O'CONNOR JOHNSON KINDNESS PLLC

(57) ABSTRACT

A display panel including light-sensing devices and light-detection circuits. The light-detection circuit includes a sensing module, a reading module, and a resetting module. The sensing module includes a control terminal electrically connected to the light-sensing device and the resetting module, an input terminal electrically connected to a first signal line, and an output terminal electrically connected to the reading module. Further, a first light-sensing device is electrically connected to the control terminal of the sensing module in a first light-detection circuit, and a second light-sensing device is electrically connected to the control terminal of the sensing module in a second light-detection circuit. The second light-detection circuit further includes a first capacitor, and the first capacitor is electrically connected to the control terminal of the sensing module in the second light-detection circuit.

18 Claims, 18 Drawing Sheets

(51) Int. Cl.
   *G01J 1/42*     (2006.01)
   *G01J 1/44*     (2006.01)
   *G06V 40/12*    (2022.01)
   *G06V 40/13*    (2022.01)
   *G09G 3/32*     (2016.01)
   *H10K 39/34*    (2023.01)
   *H10K 59/35*    (2023.01)
   *H10K 59/38*    (2023.01)
   *H10K 59/65*    (2023.01)
   *H10K 59/80*    (2023.01)

(52) U.S. Cl.
   CPC ............ *G01J 1/44* (2013.01); *G06V 40/1318* (2022.01); *G06V 40/1341* (2022.01); *H10K 39/34* (2023.02); *H10K 59/35* (2023.02); *G01J 2001/446* (2013.01); *G09G 3/32* (2013.01); *G09G 2360/144* (2013.01); *H10K 59/38* (2023.02); *H10K 59/65* (2023.02); *H10K 59/8792* (2023.02)

(56) References Cited

U.S. PATENT DOCUMENTS

2010/0253614 A1* 10/2010 Chen ............... G09G 3/3406
                                                    349/116
2012/0002090 A1*  1/2012 Aoki ............... G09G 3/3413
                                                    348/297

\* cited by examiner

DISPLAY PANEL AND DISPLAY DEVICES WITH LIGHT DETECTION CIRCUITS

CROSS-REFERENCE TO RELATED APPLICATIONS

The present application claims priority to Chinese Patent Application No. 202310226565.0, filed on Mar. 9, 2023, the content of which is incorporated herein by reference in its entirety.

TECHNICAL FIELD

The present disclosure relates to the technical field of display, and in particular to a display panel and a display device.

BACKGROUND

In an embedded fingerprint sensor display panel, fingerprint sensors are evenly arranged in a display region to increase a quantity of sensing points for fingerprint recognition. With a large quantity of fingerprint sensors in the display region, a position for arranging an ambient light sensor is limited, resulting in a relatively small amount of ambient light received by the ambient light sensor. In this case, light rays emitted by the display panel during display has relatively great impact on the ambient light sensor, resulting in that the ambient light sensor cannot accurately detect changes in the ambient light. Consequently, in the embedded fingerprint sensor display panel, there is a problem of inaccurate detection of the ambient light by the ambient light sensor.

SUMMARY

In view of this, embodiments of the present disclosure provide a display panel and a display device.

According to a first aspect, an embodiment of the present disclosure provides a display panel, including light-sensing devices and light-detection circuits. The light-detection circuits each include a sensing module, a reading module, and a resetting module. The sensing module includes a control terminal electrically connected to the light-sensing device and the resetting module, an input terminal electrically connected to a first signal line, and an output terminal electrically connected to the reading module. The plurality of light-sensing devices include a first light-sensing device and a second light-sensing device, and the plurality of light-detection circuits include a first light-detection circuit and a second light-detection circuit. The first light-sensing device is electrically connected to the control terminal of the sensing module in the first light-detection circuit, and the second light-sensing device is electrically connected to the control terminal of the sensing module in the second light-detection circuit. The second light-detection circuit further includes a first capacitor, and the first capacitor is electrically connected to the control terminal of the sensing module in the second light-detection circuit. According to a second aspect, an embodiment of the present disclosure further provides a display device, the display panel includes light-sensing devices and light-detection circuits. The light-detection circuits each include a sensing module, a reading module, and a resetting module. The sensing module includes a control terminal electrically connected to the light-sensing device and the resetting module, an input terminal electrically connected to a first signal line, and an output terminal electrically connected to the reading module. The plurality of light-sensing devices include a first light-sensing device and a second light-sensing device, and the plurality of light-detection circuits include a first light-detection circuit and a second light-detection circuit. The first light-sensing device is electrically connected to the control terminal of the sensing module in the first light-detection circuit, and the second light-sensing device is electrically connected to the control terminal of the sensing module in the second light-detection circuit. The second light-detection circuit further includes a first capacitor, and the first capacitor is electrically connected to the control terminal of the sensing module in the second light-detection circuit.

BRIEF DESCRIPTION OF DRAWINGS

To describe the technical solutions of the embodiments of the present disclosure more clearly, the following briefly describes the accompanying drawings required in the embodiments. Apparently, the accompanying drawings in the following description show merely some examples of the present disclosure, and a person of ordinary skill in the art can still derive other drawings from these accompanying drawings without creative efforts.

DESCRIPTION OF EMBODIMENTS

In order to better understand technical solutions of the present disclosure, the embodiments of the present disclosure are described in detail with reference to the drawings.

It should be noted that, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments and appended claims of the present disclosure include plural forms.

It should be understood that the term "and/or" in this specification merely describes associations between associated objects, and it indicates three types of relationships. For example, A and/or B may indicate that A exists alone, A and B coexist, or B exists alone. In addition, the character "/" in this specification generally indicates that the associated objects are in an "or" relationship.

In the description of this specification, it should be understood that the terms such as "substantially", "approximate to", "approximately", "about", "roughly", and "in general" described in the claims and embodiments of the present disclosure mean general agreement within a reasonable process operation range or tolerance range, rather than an exact value.

It should be understood that although the terms such as first, second, and third may be used to describe scanning sub-lines in the embodiments of the present disclosure, these scanning sub-lines should not be limited to these terms. These terms are used only to distinguish between the scanning sub-lines and the like from each other. For example, without departing from the scope of the embodiments of the present disclosure, a first scanning sub-line may also be referred to as a second scanning sub-line, and similarly, the second scanning sub-line may also be referred to as the first scanning sub-line.

The applicant of the present disclosure provided a solution to the problem existing in the prior art through careful and in-depth research.

Figure 1:
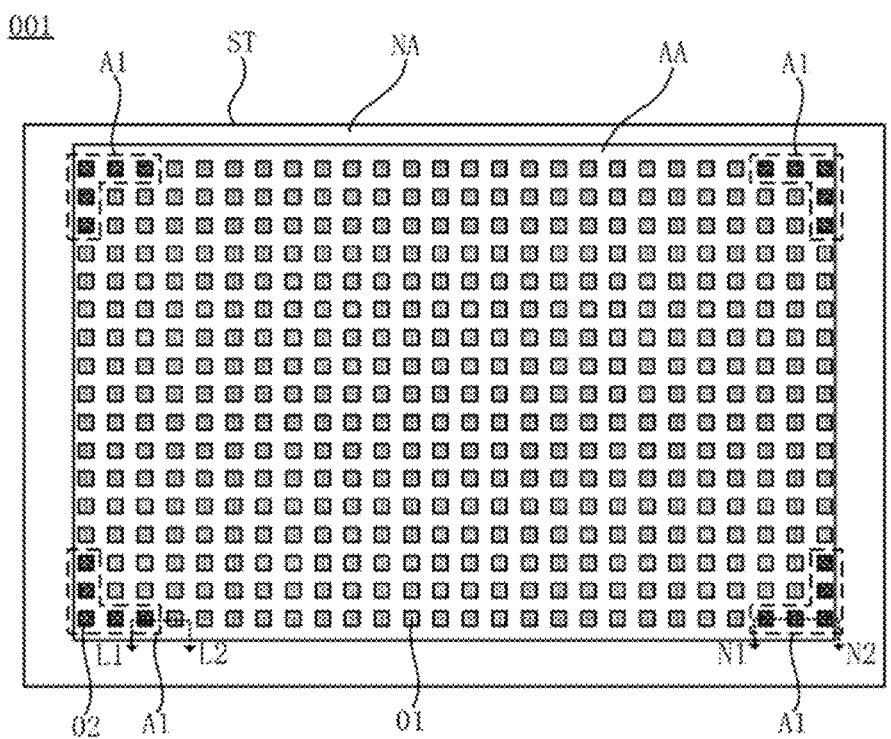
FIG. 1 is a schematic plane diagram of a display panel according to an embodiment of the present disclosure.

FIG. 1 is a schematic plane diagram of a display panel according to an embodiment of the present disclosure.

As shown in FIG. 1, the display panel 001 provided in this embodiment of the present disclosure includes first-type light-detection units 01 and second-type light-detection units 02. The first-type light-detection unit 01 and the second-type light-detection unit 02 are separately configured to detect different types of light signals. For example, the first-type light-detection unit 01 is configured to detect a light signal in a biological feature recognition process, such as a light signal in a fingerprint recognition process and a light signal in a palm recognition process; the second-type light-detection unit 02 is configured to detect a light signal in an ambient light detection process.

In addition, the display panel 001 further includes a substrate ST, and the first-type light-detection unit 01 and the second-type light-detection unit 02 may be disposed at a same side of the substrate ST.

Figure 2:
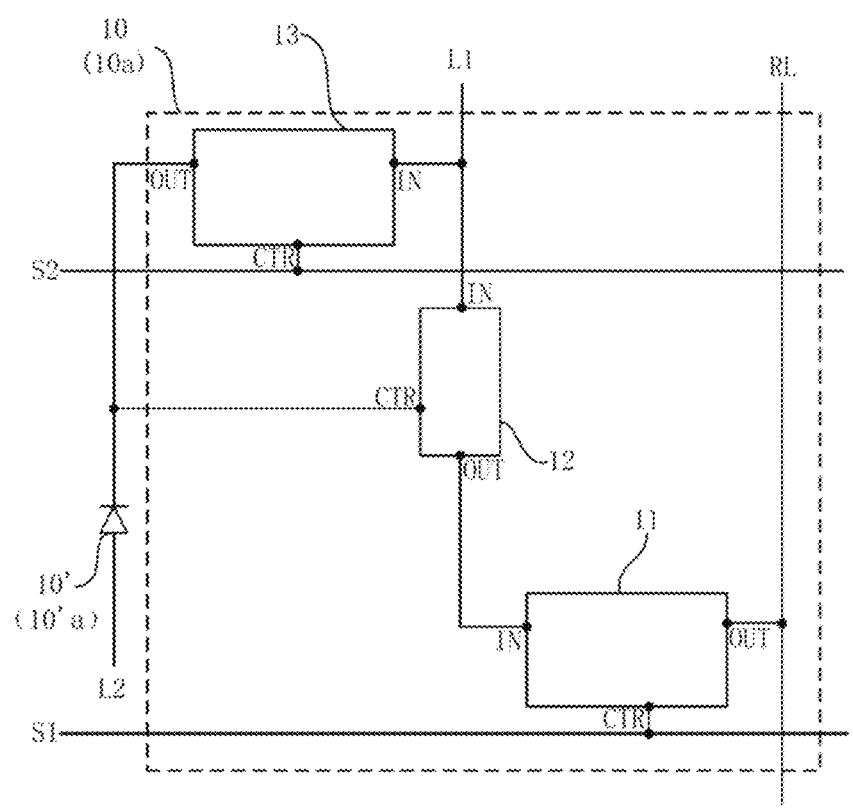
FIG. 2 is a schematic modular diagram of a first-type light-detection unit in the display panel shown in FIG. 1.
Figure 3:
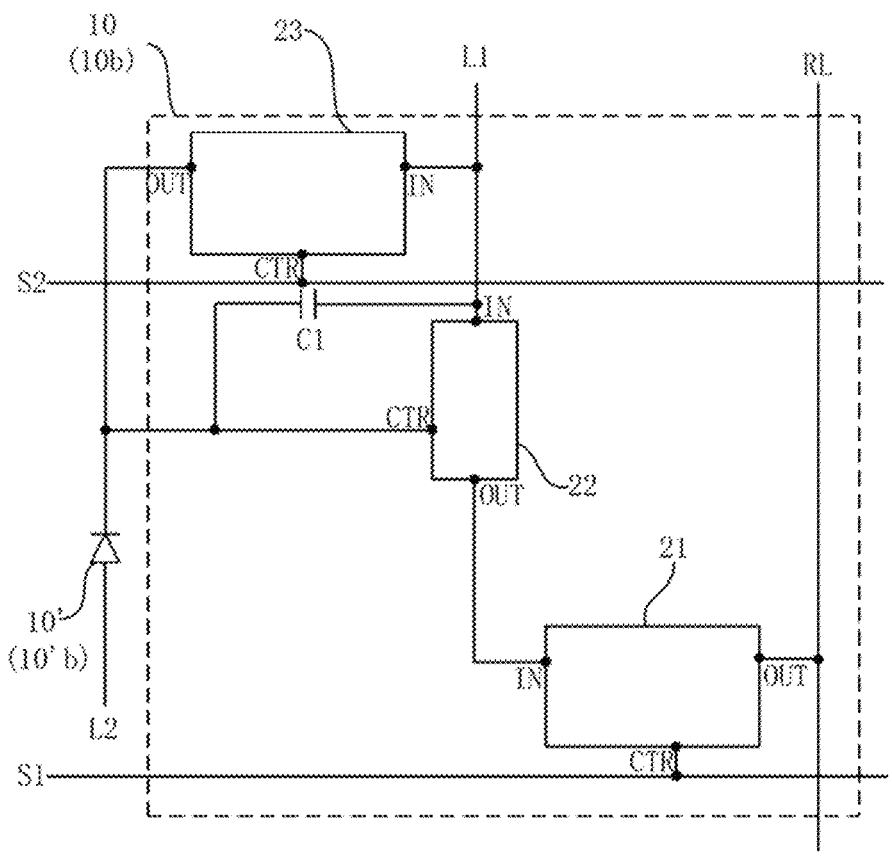
FIG. 3 is a schematic modular diagram of a second-type light-detection unit in a display panel.

FIG. 2 is a schematic modular diagram of the first-type light-detection unit in the display panel shown in FIG. 1. FIG. 3 is a schematic modular diagram of a second-type light-detection unit in a display panel.

With reference to FIG. 2 and FIG. 3, the first-type light-detection unit 01 and the second-type light-detection unit 02 each include a light-sensing device 10' and each include a light-detection circuit 10. To be specific, the display panel 001 includes light-sensing devices 10' and light-detection circuits 10.

Still referring to FIG. 2 and FIG. 3, the light-detection circuits 10 separately included in the first-type light-detection unit 01 and the second-type light-detection unit 02 each include a sensing module 12/22, a reading module 11/21, and a resetting module 13/23. In addition, the sensing module 12/22 includes a control terminal CTR electrically connected to the light-sensing device 10' and the resetting module 13/23, an input terminal IN electrically connected to a first signal line L1, and an output terminal OUT electrically connected to the reading module 11/21. To be specific, regardless of whether the light-detection circuit 10 in the plurality of light-detection circuits 10 included in the display panel 001 belongs to the first-type light-detection unit 01 or the second-type light-detection unit 02, the light-detection circuits 10 each include the sensing module 12/22, the reading module 11/21, and the resetting module 13/23, and the sensing module 12/22, the reading module 11/21, and the resetting module 13/23 in the light-detection circuit 10 have different electrical connection manners.

It should be noted that, for clear illustration, the sensing module included in the light-detection circuit 10 in the first-type light-detection unit 01 is denoted as a sensing module 12, the reading module is denoted as a reading module 11, and the resetting module is denoted as a resetting module 13; and the sensing module included in the light-detection circuit 10 in the second-type light-detection unit 02 is denoted as a sensing module 22, the reading module is denoted as a reading module 21, and the resetting module is denoted as a resetting module 23.

The light-sensing device 10' is configured to integrate light signals illuminated thereon and convert the light signal into an electrical signal. The resetting module 13/23 is configured to reset the control terminal CTR of the sensing module 12/22. The sensing module 12/22 is configured to receive the electrical signal output by the light-sensing device 10' and convert and amplify the received electrical signal. The reading module 11/21 is configured to control the signal converted and amplified by the sensing module 12/22 to be read after being output.

The plurality of light-sensing devices 10' include a first light-sensing device 10'*a* and a second light-sensing device 10'*b*, and the plurality of light-detection circuits 10 include a first light-detection circuit 10*a* and a second light-detection circuit 10*b*. The first light-sensing device 10'*a* is electrically connected to the control terminal CTR of the sensing module 12 in the first light-detection circuit 10*a*, and the second light-sensing device 10'*b* is electrically connected to the control terminal CTR of the sensing module 22 in the second light-detection circuit 10*b*. It may be understood that the first-type light-detection unit 01 includes the first light-sensing device 10'*a* and the first light-detection circuit 10*a* that are electrically connected, and the second-type light-detection unit 02 includes the second light-sensing device 10'*b* and the second light-detection circuit 10*b* that are electrically connected.

The first-type light-detection unit 01 and the second-type light-detection unit 02 are both configured to collect and detect the light signal. Therefore, the light-detection circuit 10*a* in the first-type light-detection unit 01 and the light-detection circuit 10*b* in the second-type light-detection unit 02 may adopt a same structure. This can reduce design difficulty and drive difficulty. However, detection accuracy required by different types of light-detection units is different. A description is provided by using an example in which the first-type light-detection unit 01 is configured to detect the light signal in the fingerprint recognition process and the second-type light-detection unit 02 is configured to detect the light signal in the ambient light detection process. Since fingerprint recognition requires relatively strong detection accuracy, a capacitance of a storage capacitor included in the light-detection circuit 10 in the first-type light-detection unit 01 may be relatively small. The storage capacitor is a capacitor electrically connected to the control terminal of the sensing module 12 in the light-detection circuit 10, and is generally a capacitor between an anode and a cathode of the light-sensing device 10' (not shown in the figure). However, when storage capacitors in the light-detection circuits 10 separately included in the second-type light-detection unit 02 and the first-type light-detection unit 01 are the same and have a relatively small capacitance, display light rays emitted by the display panel 001 and superimposed on ambient light with a relatively small intensity possibly cause the second-type light-detection unit 02 to work. In this case, the second-type light-detection unit 02 cannot accurately detect a change of the ambient light.

In this embodiment of the present disclosure, the second light-detection circuit 10*b* further includes a first capacitor C1. The first capacitor C1 is electrically connected to the control terminal CTR of the sensing module 22 in the second light-detection circuit 10*b*. To be specific, the second light-detection circuit 10*b* in the second-type light-detection unit 02 is provided with the added first capacitor C1 electrically connected to the control terminal CTR of the sensing module 22 compared with the first light-detection circuit 10*a* in the first-type light-detection unit 01.

The first capacitor C1 is added in the control terminal CTR of the sensing module 22 in the second light-detection circuit 10*b*, such that a load capacitance of the control terminal CTR of the sensing module 22 is increased. Therefore, the second-type light-detection unit 02 may begin to work when a light signal received and detected by the second-type light-detection unit 02 is relatively large. This reduces impact of display light rays emitted by the display panel 001 on the light signal that needs to be detected by the second-type light-detection unit 02, and improves accuracy of detection performed by the second-type light-detection unit 02 on the light signal.

In an embodiment, a capacitive load of the control terminal of the sensing module 12 in the first light-detection circuit 10*a* is less than a capacitive load of the control terminal of the sensing module 22 in the second light-detection circuit 10*b*. Regardless of whether the control terminal of the sensing module 12 in the first light-detection circuit 10*a* is electrically connected to a capacitor, because of existence of a parasitic capacitor, a capacitive load exists on the control terminal of the sensing module 12 in the first light-detection circuit 10*a*. However, the capacitive load of the control terminal of the sensing module 12 in the second light-detection circuit 10*b* exists because of not only a parasitic capacitor but also the first capacitor C1.

In a technical solution, the first light-detection circuit 10*a* is not provided with a capacitor compared with the second light-detection circuit 10*b*. To be specific, a capacitor having an electrical connection relationship with the first capacitor C1 does not exist in the first light-detection circuit 10*a* compared with the second light-detection circuit 10*b*. The first capacitor C1 is mainly added in the second light-detection circuit 10*b* compared with the first light-detection circuit 10*a*. Other modules in the second light-detection circuit 10*b* are basically the same as modules included in the first light-detection circuit 10*a*. Therefore, design difficulty and drive difficulty of the light-detection circuit 10 in the display panel 001 are not excessively increased.

In the display panel 001 provided in this embodiment of the present disclosure, as shown in FIG. 1, the first-type light-detection units 01 may be relatively evenly distributed in a display region AA of the display panel 001. A quantity of the second-type light-detection units 02 may be less than a quantity of the first-type light-detection units 01. The second-type light-detection units 02 may be also disposed in a region having a distance of 3.5 mm to an edge of the display region AA in the display region AA of the display panel 001. That is, the second-type light-detection units 02 are mainly disposed in a region in the display region AA of the display panel 001 and close to a non-display region NA.

Correspondingly, the second light-detection circuit 10*b* may be also disposed in a region having a distance of 3.5 mm to an edge of the display region AA in the display region AA of the display panel 001. That is, the second light-detection circuits 10*b* are mainly disposed in a region in the display region AA of the display panel 001 and close to the non-display region NA. The second light-sensing device 10*a* may be also disposed in a region having a distance of 3.5 mm to an edge of the display region AA in the display region AA of the display panel 001. That is, the second light-sensing devices 10*a* are mainly disposed in a region in the display region AA of the display panel 001 and close to the non-display region NA.

As shown in FIG. 1, the second-type light-detection unit 02 may be disposed in regions at four corners of the display region AA of the display panel 001. In addition, the second-type light-detection unit 02 may be alternatively disposed in a region close to a left or right edge in the display region AA of the display panel 001, and/or the second-type light-detection unit 02 may be alternatively disposed in a region close to an upper or lower edge in the display region AA of the display panel 001.

Figure 4:
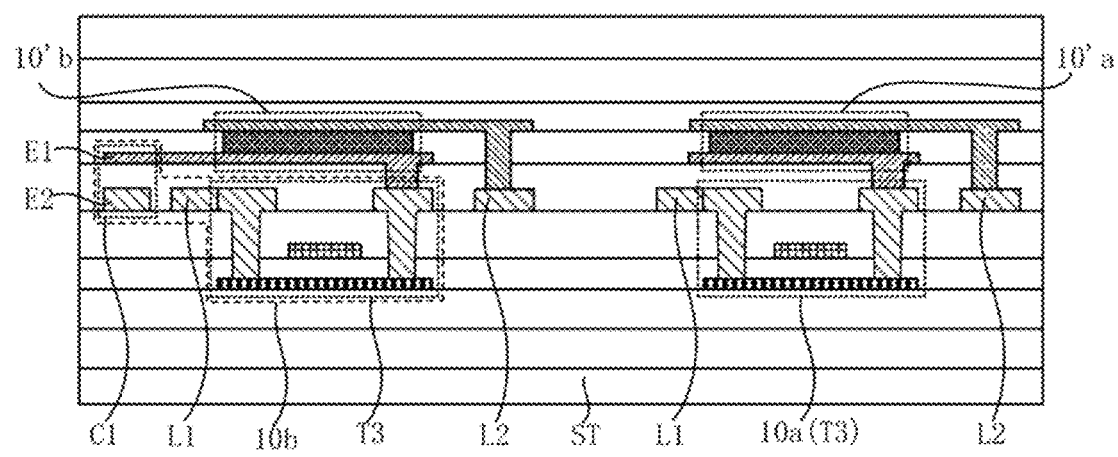
FIG. 4 is a schematic cross-sectional diagram along an L1-L2 direction shown in FIG. 1.

FIG. 4 is a schematic cross-sectional diagram along an L1-L2 direction shown in FIG. 1.

In an embodiment of the present disclosure, with reference to FIG. 4 and FIG. 2 and FIG. 3, the first light-sensing device 10'a and the second light-sensing device 10'b are each a photodiode. A first electrode of the photodiode is electrically connected to a second signal line L2 and a second electrode of the photodiode is electrically connected to the control terminal CTR of the sensing module 12/22. Specifically, with reference to FIG. 2 and FIG. 3, the first electrode of the photodiode is an anode and the second electrode of the photodiode is a cathode. In this case, the anode of the photodiode is electrically connected to the second signal line L2 and the cathode of the photodiode is electrically connected to the control terminal CTR of the sensing module 12/22.

In an embodiment of the present disclosure, when a first plate E1 of the first capacitor C1 is electrically connected to the control terminal CTR of the sensing module 22 in the second light-detection circuit 10b and the second electrode of the photodiode is also electrically connected to the control terminal CTR of the sensing module 22, the first plate E1 of the first capacitor C1 and the second electrode of the photodiode may be disposed at a same layer and the first plate E1 of the first capacitor C1 is electrically connected to the second electrode of the photodiode in the second-type light-detection unit 02. It may be understood as that the second electrode (the cathode) of the photodiode in the second-type light-detection unit 02 extends outwards and the second electrode extends to a portion outside a region of the second light-sensing device 10'b and forms the first plate E1 of the first capacitor C1.

In an embodiment of the present disclosure, the first plate E1 of the first capacitor C1 is electrically connected to the control terminal CTR of the sensing module 22 in the second light-detection circuit 10b, and a second plate E2 of the first capacitor C1 is electrically connected to the first signal line L1. That is, a potential signal of the second plate E2 of the first capacitor C1 is a potential signal transmitted by the first signal line L1.

In a technical solution corresponding to this embodiment, the second plate E2 of the first capacitor C1 and the first signal line L1 may be disposed at a same layer, and the second plate E2 of the first capacitor C1 may be formed as follows: The first signal line L1 extends to a region of the first plate E1 of the first capacitor C1 and is designed to be widened, and the widened portion may be used as the second plate E2 of the first capacitor C1.

Figure 5:
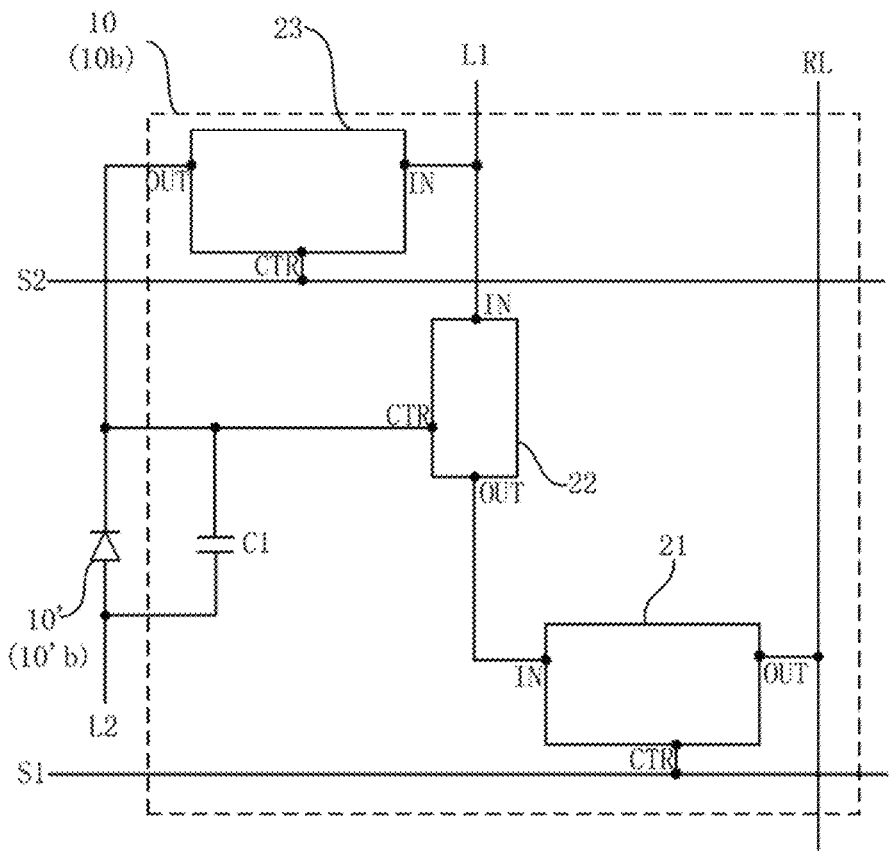
FIG. 5 is another schematic modular diagram of a second-type light-detection unit in the display panel shown in FIG. 1.
Figure 6:
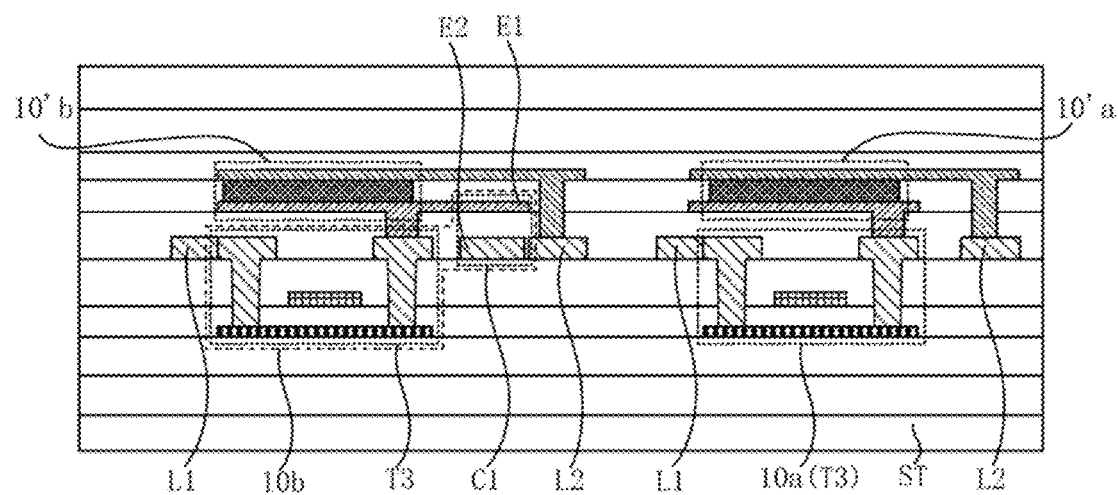
FIG. 6 is another schematic cross-sectional diagram along an M1-M2 direction shown in FIG. 1.

FIG. 5 is another schematic modular diagram of a second-type light-detection unit in the display panel shown in FIG. 1. FIG. 6 is another schematic cross-sectional diagram along an M1-M2 direction shown in FIG. 1.

In an embodiment of the present disclosure, with reference to FIG. 6 and FIG. 2 and FIG. 5, the first plate E1 of the first capacitor C1 is electrically connected to the control terminal CTR of the sensing module 22 in the second light-detection circuit 10b, and the second plate E2 of the first capacitor C1 is electrically connected to the second signal line L2.

In a technical solution corresponding to this embodiment, the second plate E2 of the first capacitor C1 and the second signal line L2 may be disposed at a same layer, and the second plate E2 of the first capacitor C1 may be formed as follows: The second signal line L2 is designed to be widened to a region of the first plate E1 of the first capacitor C1, and the widened portion may be used as the second plate E2 of the first capacitor C1.

Regardless of whether the second plate of the first capacitor C1 is electrically connected to the first signal line L1 or the second signal line L2, the first signal line L1 and the second signal line L2 can be disposed at a same layer. That is, the second plate E2 of the first capacitor C1, the first signal line L1, and the second signal line L2 are disposed at a same layer. In this case, procedures in a fabrication process of the display panel 001 can be reduced. This saves time and costs.

The storage capacitor in the light-detection circuit 10 is usually formed by a capacitance between an anode and a cathode of the light-sensing device 10'. Since a distance between the anode and the cathode is relatively far, a capacitance of the storage capacitor is relatively small. An increase in the capacitance of the storage capacitor is limited because of the relatively far distance between the anode and the cathode even though the capacitance of the storage capacitor in the second light-detection circuit 10b is increased by increasing an area between the anode and the cathode.

In this embodiment of the present disclosure, the first capacitor C1 is added in the second light-detection circuit 10b, and the first plate E1 and the second plate E2 of the first capacitor C1 are respectively disposed at a same layer as that of the cathode of the second light-sensing device 10'b and the first signal line L1 and/or the second signal line L2. In this case, a first capacitor C1 with a relatively large capacitance is easily obtained.

Figure 7:
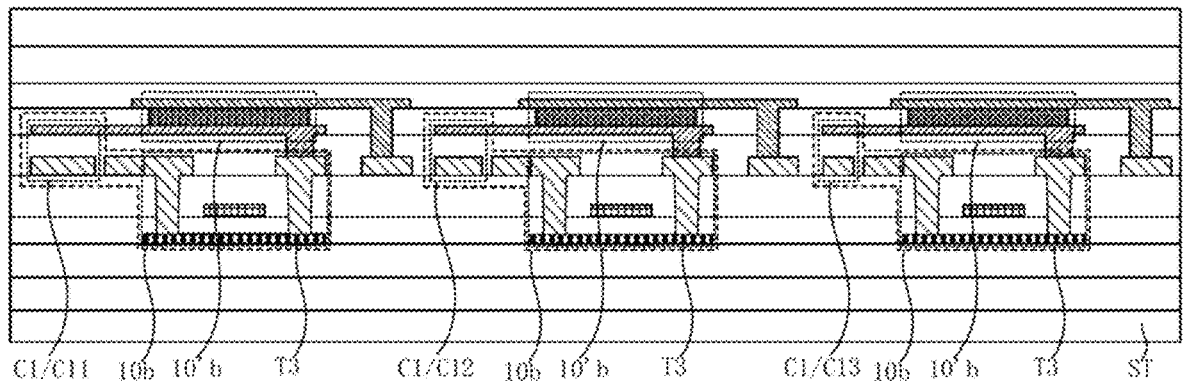
FIG. 7 is a schematic cross-sectional diagram along an N1-N2 direction shown in FIG. 1.

FIG. 7 is a schematic cross-sectional diagram along an N1-N2 direction shown in FIG. 1.

In an embodiment of the present disclosure, with reference to FIG. 1 and FIG. 7, the display panel 001 is provided with second light-detection circuits 10b, and capacitances of first capacitors C1 separately included in at least two of the second light-detection circuits 10b are different. Capacitances of first capacitors C1 in the plurality of second light-detection circuits 10b are provided to be different, such that detection accuracy of the second light-detection circuit 10b can be increased.

In FIG. 7, a value of the capacitance of the first capacitor C1 is roughly represented by a size of a direct facing area of upper and lower plates in the first capacitor C1. In this case, in three second light-detection circuits 10b shown in FIG. 7, capacitances of first capacitors C1 in the second light-detection circuits 10b are different from one another. It should be noted that, capacitances of a first capacitor C11, a first capacitor C12, and a first capacitor C13 in the three second light-detection circuits 10b that are arranged from left to right in FIG. 7 sequentially decrease. However, the present disclosure does not limit change regularity of capacitances of first capacitors C1 in second light-detection circuits 10b at different positions.

In an application scenario, capacitances of first capacitors C1 separately included in at least some of the second light-detection circuits 10b in the display panel 001 are different. In this case, some of the second light-detection circuits 10b may detect a light signal in a specific intensity range in corporation with the second light-sensing device 10'b, and some of the second light-detection circuits 10b may detect a light signal in another specific intensity range in corporation with the second light-sensing device 10'b. A description is provided by using an example in which the second light-detection circuit 10b and the second light-sensing device 10'b electrically connected to the second light-detection circuit 10b are configured to detect ambient light. When the brightness of the ambient light is higher, the second light-detection circuit 10a including a first capacitor C1 with a smaller capacitance can work, is less affected by display light emitted from the display panel 001, and has high sensitivity. When the brightness of the ambient light is lower, the first light-detection circuit 10*a* including a first capacitor C1 with a larger capacitance can work and is less affected by display light emitted from the display panel 001 in this case.

In this application scenario, the capacitances of the first capacitors C1 separately included in the plurality of second light-detection circuits 10*b* in the display panel 001 are different, and the second light-detection circuits 10*b* may work in time periods according to intensities of the light signals.

In an application scenario, capacitances of first capacitors C1 separately included in the plurality of second light-detection circuits 10*b* are different. In this case, the second light-detection circuits 10*b* may detect light signals of different intensities in a same time period in corporation with the second light-sensing device 10'*b*, and use an average as a final detection result, to improve detection accuracy.

In a technical solution corresponding to this embodiment, as shown in FIG. 1, the display panel 001 includes at least one first region A1. The first region A1 may be located in a corner position of the display region AA in the display panel 001 as shown in FIG. 1. In addition, the first region A1 may be alternatively located in at least one of positions of left, right, upper, and lower edges of the display region AA in the display panel 001. The first region A1 includes second-type light-detection units 02. In this case, the first region A1 includes second light-detection circuits 10*b*, and capacitances of first capacitors C1 separately included in at least two second light-detection circuits 10*b* in the first region A1 are different.

Intensities of light signals in different regions of the display panel 001 may be different, and this technical solution is equivalent to centrally disposing second light-detection circuits 10*b* separately including different first capacitors C1 in at least one region of the display panel 001. In this case, intensities of light signals at a same position of the display panel 001 can be more accurately detected.

Figure 8:
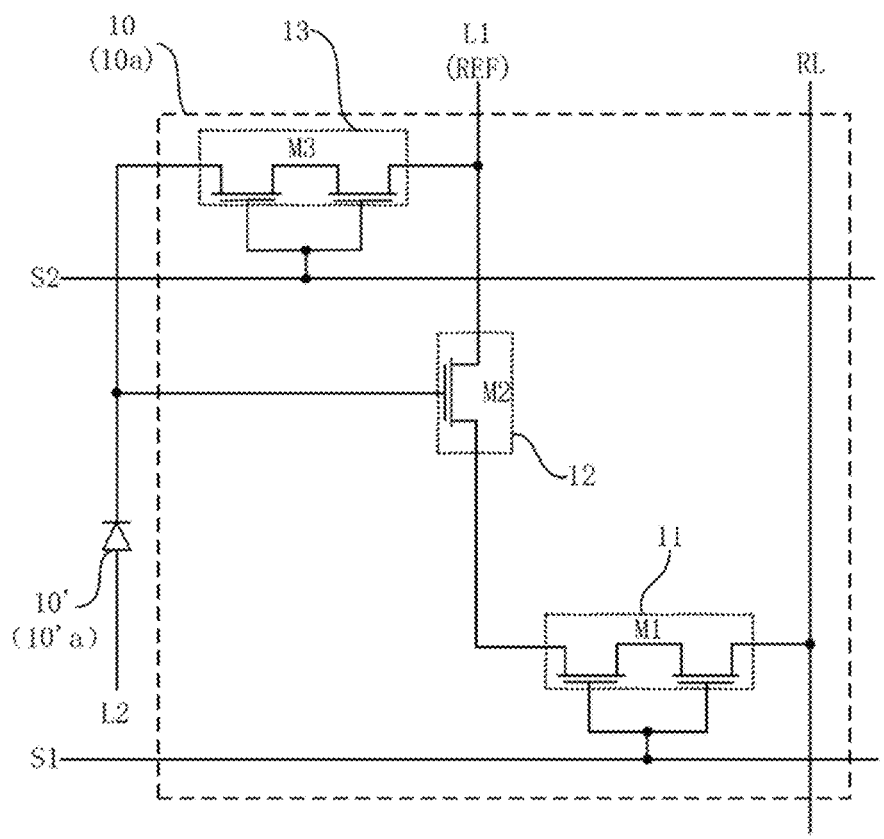
FIG. 8 is an equivalent circuit diagram of the first-type light-detection unit in the display panel shown in FIG. 1.
Figure 9:
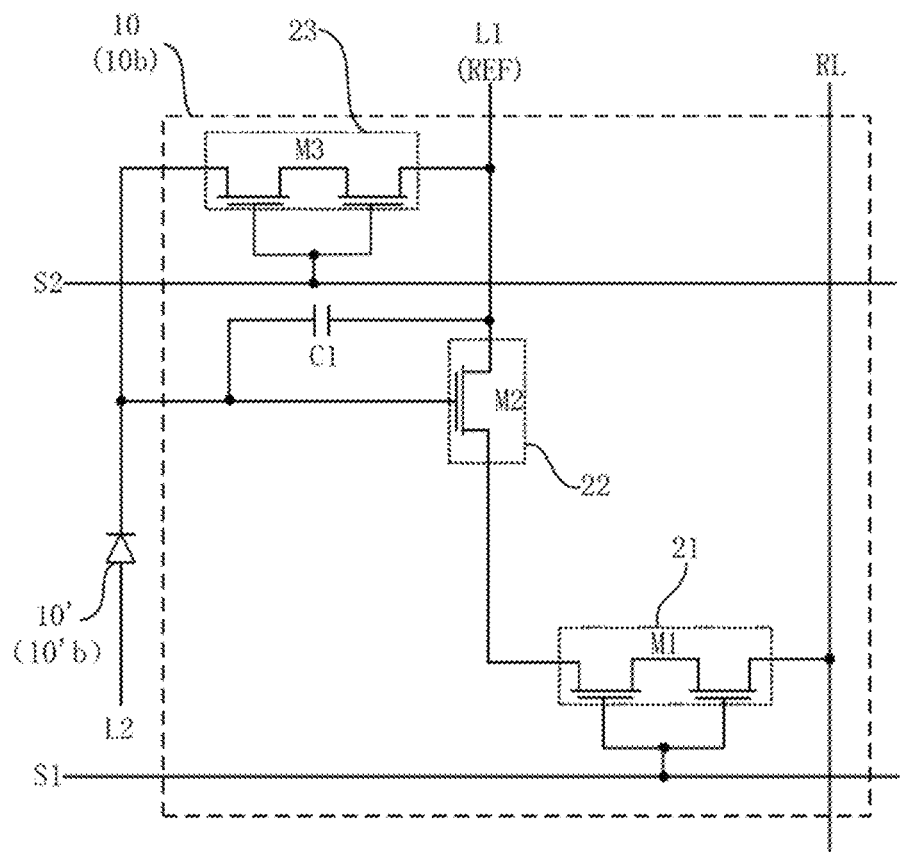
FIG. 9 is an equivalent circuit diagram of the second-type light-detection unit in the display panel shown in FIG. 1.

FIG. 8 is an equivalent circuit diagram of the first-type light-detection unit in the display panel shown in FIG. 1. FIG. 9 is an equivalent circuit diagram of the second-type light-detection unit in the display panel shown in FIG. 1.

In an embodiment of the present disclosure, as shown in FIG. 8 and FIG. 9, the reading module 11/21 includes a first transistor M1, the sensing module 12/22 includes a second transistor M2, and the resetting module 13/23 includes a third transistor M3. A gate of the second transistor M2 is electrically connected to the light-sensing device 10' and an output terminal OUT of the third transistor M3, an input terminal of the second transistor M2 is electrically connected to the first signal line L1, and an output terminal of the second transistor M2 is electrically connected to an input terminal of the first transistor M1. A gate of the first transistor M1 is electrically connected to a first scanning line S1, the input terminal of the first transistor M1 is electrically connected to the output terminal of the second transistor M2, and an output terminal of the first transistor M1 is electrically connected to a read signal line RL. A gate of the third transistor M3 is electrically connected to a second scanning line S2, an input terminal of the third transistor M3 is electrically connected to a reset signal line REF, and the output terminal of the third transistor M3 is electrically connected to the gate of the first transistor M1.

The reset signal line REF electrically connected to the input terminal of the third transistor M3 and the first signal line L1 electrically connected to the input terminal of the second transistor M2 may be reused. That is, the input terminal of the third transistor M3 may be electrically connected to the first signal line L1.

In an embodiment of the present disclosure, the second transistor M2 included in the sensing module 12/22 is an N-type transistor.

In a technical solution corresponding to this embodiment, the second transistor M2 included in the sensing module 12/22 includes a metal oxide semiconductor layer.

To avoid changes of electric potentials of the gate and the output terminal of the second transistor M2 due to current leakage, at least one of the third transistors M3 and the first transistor M1 respectively electrically connected to the gate and the output terminal of the second transistor M2 may be a dual gate transistor.

Similarly, to avoid changes of electric potentials of the gate and the output terminal of the second transistor M2 due to current leakage, at least one of the third transistor M3 and the first transistor M1 respectively electrically connected to the gate and the output terminal of the second transistor M2 may be an N-type transistor.

Further, at least of the first transistor M1 and the third transistor M3 may include a metal oxide semiconductor layer.

Figure 10:
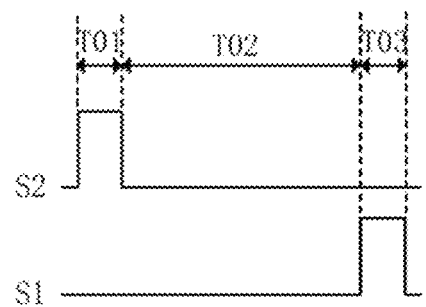
FIG. 10 is a working sequence diagram of a light-detection circuit in a display panel according to an embodiment of the present disclosure.

FIG. 10 is a working sequence diagram of a light-detection circuit in a display panel according to an embodiment of the present disclosure.

With reference to FIG. 10 and FIG. 8 and FIG. 9, a description is provided below by using a working process of the light-detection circuit 10 in combination with a time sequence. A working period of the light-detection circuit 10 includes a reset stage T1, an integration stage T2, and a read stage T3. A description is provided by using an example in which the first transistor M1, the second transistor M2, and the third transistor M3 are each an N-type transistor.

In the reset stage T1, the second scanning line S2 receives an enabling signal (a high level signal), and the third transistor M3 is turned on. In this case, a reset signal on the reset signal line REF is transmitted to the gate of the second transistor M2 and is used to reset the gate of the second transistor M2.

In the integration stage T2, the first scanning line S1 and the second scanning line S2 both transmit a non-enabling signal (a low level signal), and the first transistor M1 and the third transistor M3 are both turned off. In this case, the light-sensing device 10' integrates and converts received light signals into electrical signals and then transmits the electrical signals to the gate of the first transistor M1.

In the read stage T3, the first scanning line S1 receives an enabling signal (a high level signal), the first transistor M1 is turned on, and the read signal line RL receives a signal from the output terminal of the second transistor M2 through the turned-on first transistor M1.

It should be noted that, the foregoing merely describes a working process of one working period in the light-detection circuit 10, and a working period of the first light-detection circuit 10*a* and a working period of the second light-detection circuit 10*b* both include the foregoing three stages. However, a frequency of the working period of the first light-detection circuit 10*a* and a frequency of the working period of the second light-detection circuit 10*b* may be the same or different; the stages of the working period of the first light-detection circuit 10*a* and the stages of the working period of the second light-detection circuit 10*b* may or may not be simultaneously performed.

Figure 11:
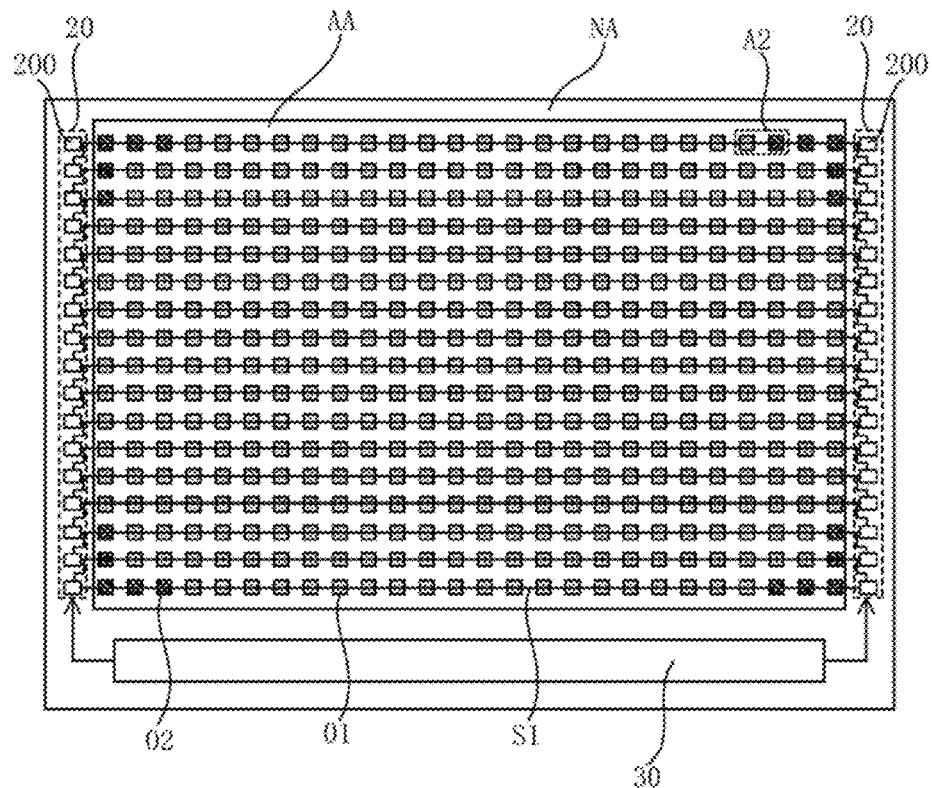
FIG. 11 is a schematic diagram of a display panel according to an embodiment of the present disclosure.
Figure 12:
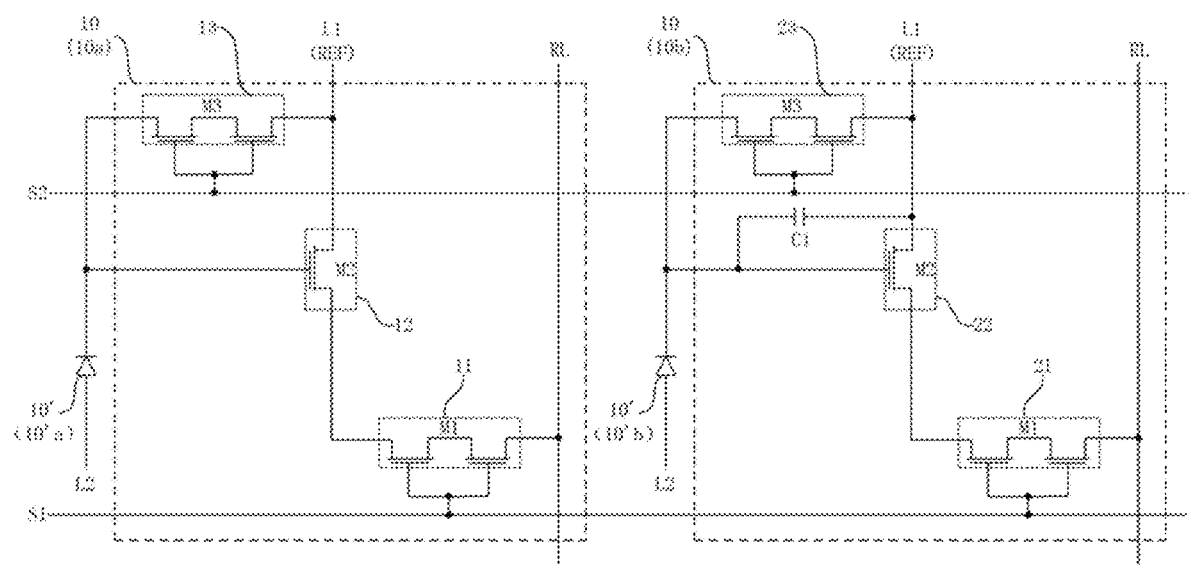
FIG. 12 is an equivalent circuit diagram of a first-type light-detection unit and a second-type light-detection unit in a region A2 of the display panel shown in FIG. 11.

FIG. 11 is a schematic diagram of a display panel according to an embodiment of the present disclosure. FIG. 12 is an equivalent circuit diagram of a first-type light-detection unit and a second-type light-detection unit in a region A2 of the display panel shown in FIG. 11.

In an embodiment of the present disclosure, as shown in FIG. 11 and FIG. 12, a first transistor M1 in at least one of second light-detection circuits 10b shares a scanning line with a first transistor M1 in at least some of first light-detection circuits 10a. For example, gates of first transistors M1 separately included in a second light-detection circuit 10b and a first light-detection circuit 10a that are located in a same row may be connected to a same first scanning line S1.

Light-detection circuits 10 in different rows sequentially transmit a signal to the read signal line RL. In this case, reading modules 11/21 in the light-detection circuits 10 in the different rows need to be sequentially turned on. That is, first transistors M1 in the light-detection circuits 10 in the different rows need to be sequentially turned on.

The display panel 001 may include first scanning lines S1, and the first scanning lines S1 are separately electrically connected to different shift registers 200 in a same shift register circuit 20. At least one first scanning line is electrically connected to both the gates of the first transistors M1 in the first light-detection circuit 10a and the second light-detection circuit 10b.

The first transistor M1 in the first light-detection circuit 10a is provided to share the first scanning line S1 with the first transistor M1 in the second light-detection circuit 10b, such that a quantity of first scanning lines S1 and drive difficulty are reduced.

An on/off state of the first transistor M1 in the first light-detection circuit 10a and an on/off state of the first transistor M1 in the second light-detection circuit 10b are provided to be controlled by the same shift register circuit 20, such that a quantity of shift register circuits can be reduced. In addition, a signal for controlling the on/off state of the first transistor can be generated after a drive chip 30 transmits a signal to the shift register circuit 20, such that a quantity of leads from the drive chip 30 to the display panel 001 is reduced, thereby easily achieving a narrow frame.

In a technical solution corresponding to this embodiment, as shown in FIG. 12, a third transistor M3 in at least one of second light-detection circuits 10b shares a scanning line with a third transistor M3 in at least some of first light-detection circuits 10a. For example, gates of third transistors M3 separately included in a second light-detection circuit 10b and a first light-detection circuit 10a that are located in a same row may be connected to a same second scanning line S2.

It should be noted that, reset stages T1 in light-detection circuits 10 in different rows may be simultaneously or sequentially performed.

When the reset stages T1 in the light-detection circuits 10 in the different rows are simultaneously performed, second scanning lines S2 in the display panel 001 may be electrically connected together and are electrically connected to the drive chip 30. The drive chip 30 provides an enabling signal and a non-enabling signal for the second scanning lines S2.

When the reset stages T1 in the light-detection circuits 10 in the different rows are sequentially performed, second scanning lines S2 in the display panel 001 may be separately electrically connected to different shift registers in the shift register circuit. The shift register circuit electrically connected to the second scanning line S2 is different from the shift register circuit electrically connected to the first scanning line S1.

Figure 13:
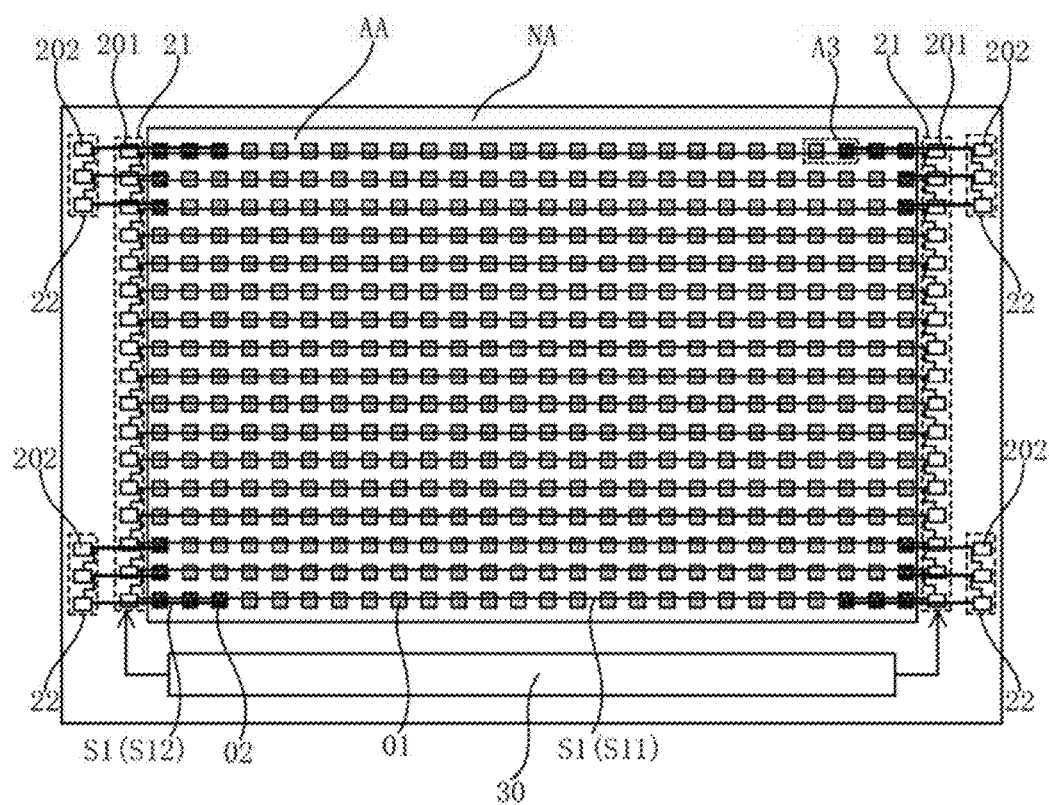
FIG. 13 is a schematic diagram of a display panel according to an embodiment of the present disclosure.
Figure 14:
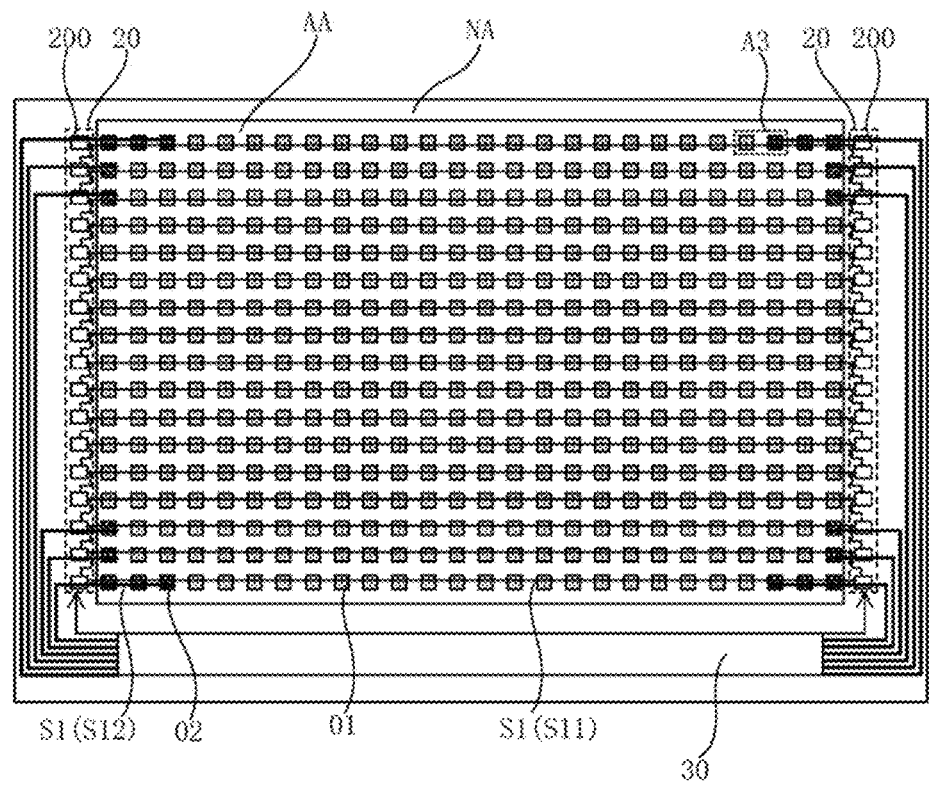
FIG. 14 is a schematic diagram of a display panel according to an embodiment of the present disclosure.
Figure 15:
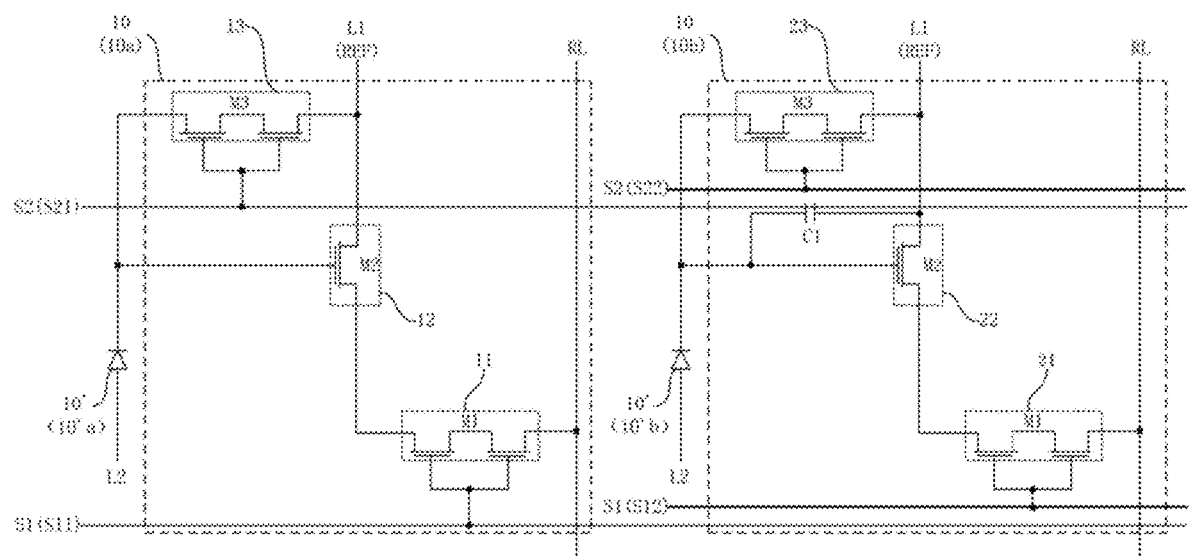
FIG. 15 is an equivalent circuit diagram of a first-type light-detection unit and a second-type light-detection unit in a region A3 of the display panel shown in FIG. 13 and FIG. 14.

FIG. 13 is a schematic diagram of a display panel according to an embodiment of the present disclosure. FIG. 14 is a schematic diagram of a display panel according to an embodiment of the present disclosure. FIG. 15 is an equivalent circuit diagram of a first-type light-detection unit and a second-type light-detection unit in a region A3 of the display panel shown in FIG. 13 and FIG. 14.

In an embodiment of the present disclosure, with reference to FIG. 13, FIG. 14, and FIG. 15, a first transistor M1 in at least some of second light-detection circuits 10b and a first transistor M1 in the first light-detection circuit 10a are separately connected to different scanning lines. For example, the display panel 001 includes first scanning lines S1, and the plurality of first scanning lines S1 include a first scanning sub-line S11 and a second scanning sub-line S12. A gate of the first transistor M1 in the first light-detection circuit 10a is electrically connected to the first scanning sub-line S11 and a gate of the first transistor M1 in the second light-detection circuit 10b is electrically connected to the second scanning sub-line S12.

When the gates of the first transistors M1 separately included in the first light-detection circuit 10a and the second light-detection circuit 10b are separately connected to different scanning lines, the first light-detection circuit 10a and the second light-detection circuit 10b may be more flexibly driven. For example, a frequency of a working period of the first light-detection circuit 10a and a frequency of a working period of the second light-detection circuit 10b are different; for example, a time length of a read stage T3 of the first light-detection circuit 10a and a time length of a read stage T3 of the second light-detection circuit 10b may be different.

In an implementation of this embodiment, as shown in FIG. 13, the display panel 001 includes a first shift register circuit 21 and a second shift register circuit 22. The first shift register circuit 21 includes cascaded first shift register circuits 201, and the second shift register circuit 22 includes cascaded second shift register circuits 202. The first scanning sub-line S11 electrically connected to the first transistor M1 in the first light-detection circuit 10a is electrically connected to the first shift register 201 in the first shift register circuit 21, and the second scanning sub-line S12 electrically connected to the first transistor M1 in the second light-detection circuit 10b is electrically connected to the second shift register 202 in the second shift register circuit 22.

As shown in FIG. 13, the second shift register circuit 22 may be located at a side of the first shift register circuit 21 away from a display region AA of the display panel 001. The second shift register circuit 22 is disposed at the side of the first shift register circuit 21 away from the display region AA, resulting in an increase in a distance between the second shift register circuit 22 and the second light-detection circuit 10b electrically connected to the second shift register circuit 22. However, because the second light-detection circuit 10b is usually disposed close to an edge of the display region AA, it can be still ensured that a voltage drop of a signal line between the second shift register circuit 22 and the second light-detection circuit 10b is not excessively large.

In an implementation of this embodiment, as shown in FIG. 14, a scanning line electrically connected to the first transistor M1 in the second light-detection circuit 10b is electrically connected to a drive chip 30. That is, the second scanning sub-line S12 is electrically connected to the drive chip 30. The drive chip 30 may provide a signal for controlling an on/off state of the first transistor M1 in the second light-detection circuit 10b for the second scanning sub-line S12.

In this case, the scanning line electrically connected to the first transistor M1 in the first light-detection circuit 10a is electrically connected to a shift register 200 included in the shift register circuit 20. That is, the first scanning sub-line S11 is electrically connected to the shift register 200 included in the shift register circuit 20.

In a technical solution corresponding to this embodiment, as shown in FIG. 15, a third transistor M3 in any of second light-detection circuits 10b and a third transistor M3 in at least some of first light-detection circuits 10a are connected to different scanning lines. For example, the display panel 001 includes second scanning lines S2, and the plurality of second scanning lines S2 include a third scanning sub-line S21 and a fourth scanning sub-line S22. A gate of the third transistor M3 in the first light-detection circuit 10a is electrically connected to the third scanning sub-line S21 and a gate of the third transistor M3 in the second light-detection circuit 10b is electrically connected to the fourth scanning sub-line S22.

It should be noted that, reset stages T1 in first light-detection circuits 10a in different rows may be simultaneously or sequentially performed; reset stages T1 in second light-detection circuits 10b in different rows may be simultaneously or sequentially performed.

When the reset stages T1 in the first light-detection circuits 10a in the different rows are simultaneously performed, third scanning sub-lines S21 in the display panel 001 may be electrically connected together and are electrically connected to the drive chip 30. The drive chip 30 provides an enabling signal and a non-enabling signal for the third scanning sub-lines S21.

When the reset stages T1 in the first light-detection circuits 10a in the different rows are sequentially performed, third scanning sub-lines S21 in the display panel 001 may be separately electrically connected to different shift registers in the shift register circuit. The shift register circuit electrically connected to the third scanning sub-line S21 is different from the shift register circuit electrically connected to the first scanning sub-line S11.

When the reset stages T1 in the second light-detection circuits 10b in the different rows are simultaneously performed, fourth scanning sub-lines S22 in the display panel 001 may be electrically connected together and are electrically connected to the drive chip 30. The drive chip 30 provides an enabling signal and a non-enabling signal for the fourth scanning sub-lines S22.

When the reset stages T1 in the second light-detection circuits 10b in the different rows are sequentially performed, fourth scanning sub-lines S22 in the display panel 001 may be separately electrically connected to different shift registers in the shift register circuit. The shift register circuit electrically connected to the fourth scanning sub-line S22 is different from the shift register circuit electrically connected to the second scanning sub-line S12.

Figure 16:
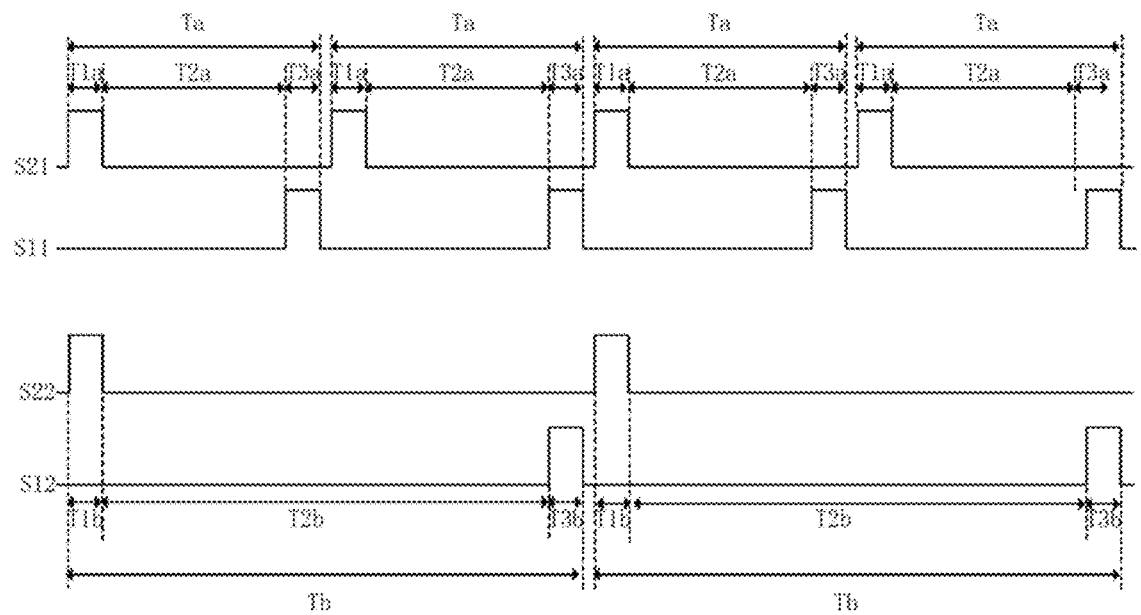
FIG. 16 is a working sequence diagram of a light-detection circuit in the first-type light-detection unit and the second-type light-detection unit shown in FIG. 15.

FIG. 16 is a working sequence diagram of a light-detection circuit in the first-type light-detection unit and the second-type light-detection unit shown in FIG. 15.

In a technical solution corresponding to this embodiment, an enabling signal received by the scanning line electrically connected to the first transistor M1 in the first light-detection circuit 10a included in the first-type light-detection unit 01 has a frequency f1, and an enabling signal received by the scanning line electrically connected to the first transistor M1 in the second light-detection circuit 10b included in the second-type light-detection unit 02 has a frequency f2, where f2<f1. That is, the frequency of the enabling signal received by the second scanning sub-line S12 is smaller than the frequency of the enabling signal received by the first scanning sub-line S11.

an enabling signal received by the scanning line electrically connected to the third transistor M3 in the first light-detection circuit 10a included in the first-type light-detection unit 01 has a frequency f3, and an enabling signal received by the scanning line electrically connected to the fourth transistor M4 in the second light-detection circuit 10b included in the second-type light-detection unit 02 has a frequency f4, where f4<f3. That is, the frequency of the enabling signal received by the fourth scanning sub-line S22 is smaller than the frequency of the enabling signal received by the third scanning sub-line S21.

In this technical solution, a frequency of a working period Ta of the second light-detection circuit 10b is less than a frequency of a working period Tb of the first light-detection circuit 10a. In this case, time in an integration stage T2b of the second light-detection circuit 10b is increased compared with a time length of an integration stage T2a of the first light-detection circuit 10a, to further increase light signals received by the second-type light-detection unit 02. This is beneficial to improving detection accuracy of the second light-detection circuit 10b.

In this technical solution, a reset stage T1b in a working period Tb of the second light-detection circuit 10b and a reset stage Tia in a working period Ta of the first light-detection circuit 10a may be simultaneously performed. However, when reset stages T1a in some working periods Ta of the first light-detection circuit 10a are performed, the second light-detection circuit 10b may be in an integration stage T2b. In addition, a read stage T3b in the working period Tb of the second light-detection circuit 10b and a read stage T3a in the working period Ta of the first light-detection circuit 10a may be simultaneously performed. However, when read stages T3a in some working periods Ta of the first light-detection circuit 10a are performed, the second light-detection circuit 10b may be in the integration stage T2b. Therefore, the second light-detection circuit 10b may share a reset signal line REF and a read signal line RL with some of first light-detection circuits 10a.

Figure 17:
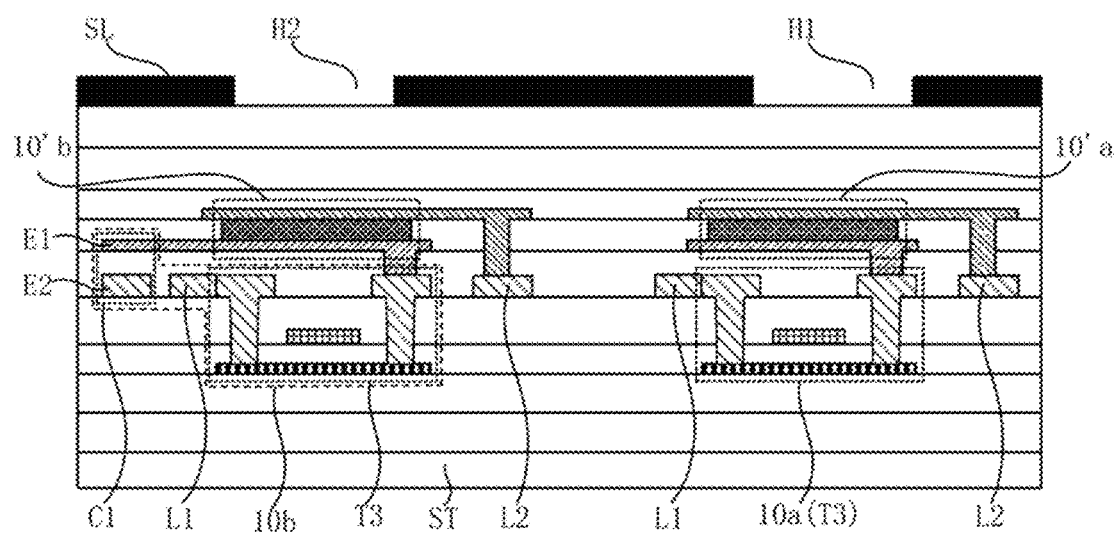
FIG. 17 is a schematic cross-sectional diagram along an L1-L2 direction shown in FIG. 1.

FIG. 17 is a schematic cross-sectional diagram along an L1-L2 direction shown in FIG. 1.

In an embodiment of the present disclosure, as shown in FIG. 17, the display panel 001 further includes a light-shielding layer SL, and the light-shielding layer SL is disposed at a side of a film, on which the light-sensing device 10' is located, facing toward a light exit surface of the display panel 001. The light-sensing device 10', the light-detection circuit 10, and the light-shielding layer SL may be disposed at a side of a substrate. In addition, the light-sensing device 10' is disposed at a side of a film, on which the light-detection circuit 10 is located, away from the substrate, and the light-shielding layer SL may be disposed at a side of the light-sensing device 10' away from the substrate.

The light-shielding layer SL includes a first opening H1 and a second opening H2. Along a direction perpendicular to a plane of the display panel 001, the first opening H1 at least partially overlaps the first light-sensing device 10'a and the second opening H2 at least partially overlaps the second light-sensing device 10'b. The light-shielding layer SL is provided with the first opening H1 corresponding to the first light-sensing device 10'a and the first opening H1 is configured to expose at least part of the first light-sensing device 10′a. The first light-sensing device 10′a may receive, through the first opening H1, a light signal that needs to be detected by the first light-sensing device 10′a. The light-shielding layer SL is provided with the second opening H2 corresponding to the second light-sensing device 10′b and the second opening H2 is configured to expose at least part of the second light-sensing device 10′b. The second light-sensing device 10′b may receive, through the second opening H2, a light signal that needs to be detected by the second light-sensing device 10′b.

Figure 18:
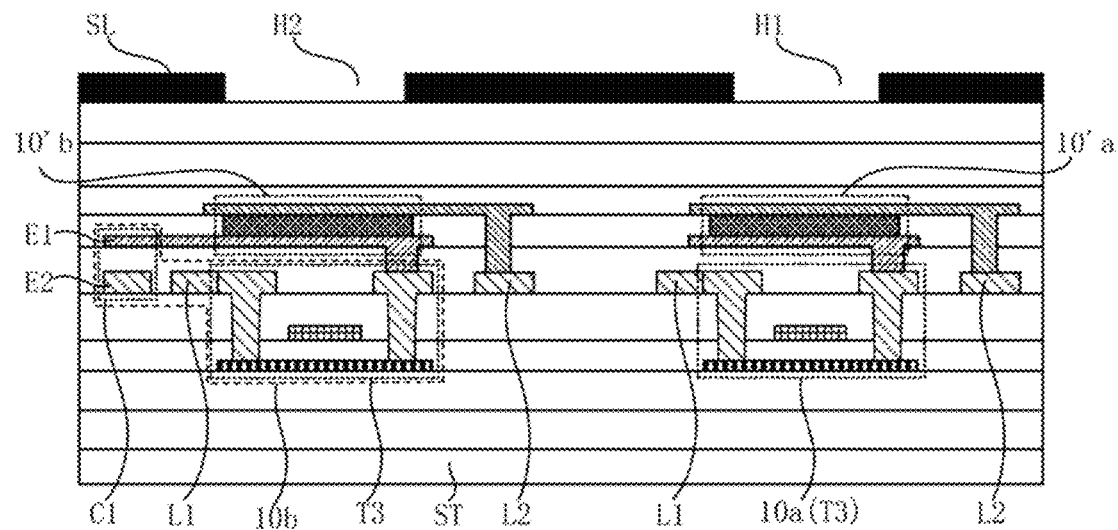
FIG. 18 is a schematic cross-sectional diagram along an L1-L2 direction shown in FIG. 1.
Figure 19:
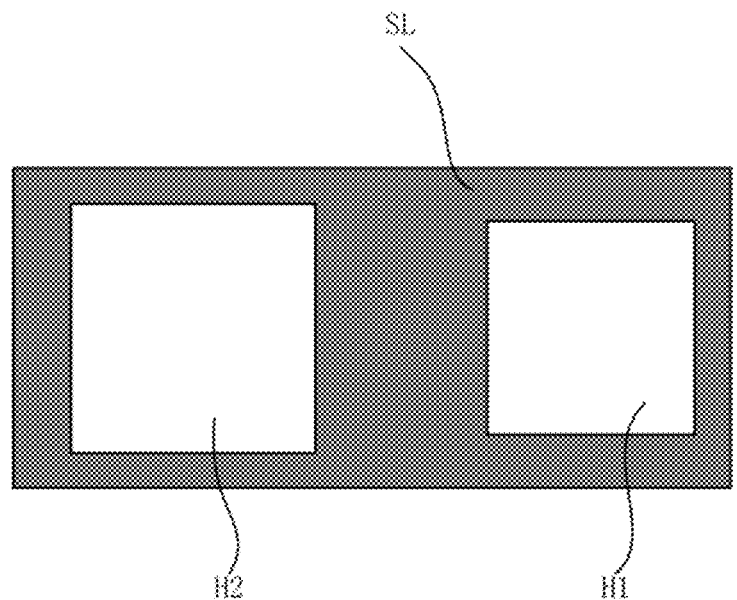
FIG. 19 is a schematic projection diagram of a light-shielding layer and a light-sensing device in FIG. 18.

FIG. 18 is a schematic cross-sectional diagram along an L1-L2 direction shown in FIG. 1. FIG. 19 is a schematic projection diagram of a light-shielding layer and a light-sensing device in FIG. 18.

In a technical solution corresponding to this embodiment, as shown in FIG. 18 and FIG. 19, an opening area of the second opening H2 is greater than an opening area of the first opening H1. In this case, the second light-sensing device 10′b may obtain a light signal with a greater signal strength from the second opening H2 with a larger opening area, increasing a light amount of light signals that need to be detected by the second-type light-detection unit 02. This can increase detection accuracy of the second light-detection circuit 10b.

It should be noted that, the first opening H1 and the second opening H2 that are provided in the light-shielding layer SL are usually formed by performing dry etching or wet etching on the light-shielding layer SL, and the most commonly used etching manner is the wet etching. In a process in which wet etching is performed on the light-shielding layer SL to form the first opening H1 and the second opening H2, areas of the bottom and the top of the first opening H1 are usually different and areas of the bottom and the top of the second opening H2 are usually different. In this case, the opening area of the first opening H1 is an area of a smaller one of the areas of the bottom and the top of the first opening H1, usually the area of the bottom; and the opening area of the second opening H2 is an area of a smaller one of the areas of the bottom and the top of the second opening H2, usually the area of the bottom.

Figure 20:
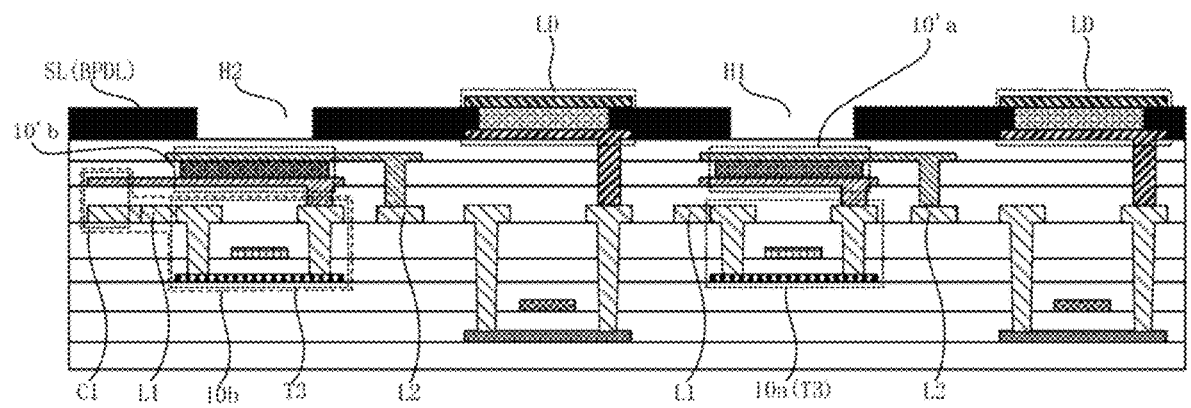
FIG. 20 is a schematic cross-sectional diagram along an L1-L2 direction shown in FIG. 1.

FIG. 20 is a schematic cross-sectional diagram along an L1-L2 direction shown in FIG. 1.

In a technical solution corresponding to this embodiment, as shown in FIG. 20, the display panel 001 includes light-emitting devices LD and a black pixel definition layer BPDL. The black pixel definition layer BPDL includes pixel openings, and at least some of the light-emitting devices LD are disposed inside the pixel openings in the black pixel definition layer BPDL. For example, the light-emitting device LD may be specifically an organic light-emitting diode (OLED), and an organic light-emitting material of the OLED may fill the pixel openings.

In this technical solution, the black pixel definition layer BPDL may be reused for a light-shielding layer SL. That is, the black pixel definition layer BPDL may be provided with a first opening H1 and a second opening H2 respectively corresponding to a first light-sensing device 10′a and a second light-sensing device 10′b. In this case, the black pixel definition layer BPDL may be used as the light-shielding layer SL in this embodiment of the present disclosure. The black pixel definition layer BPDL is reused as the light-shielding layer SL, such that a thickness of the display panel 001 and fabrication process steps and costs of the display panel 001 can be reduced.

Figure 21:
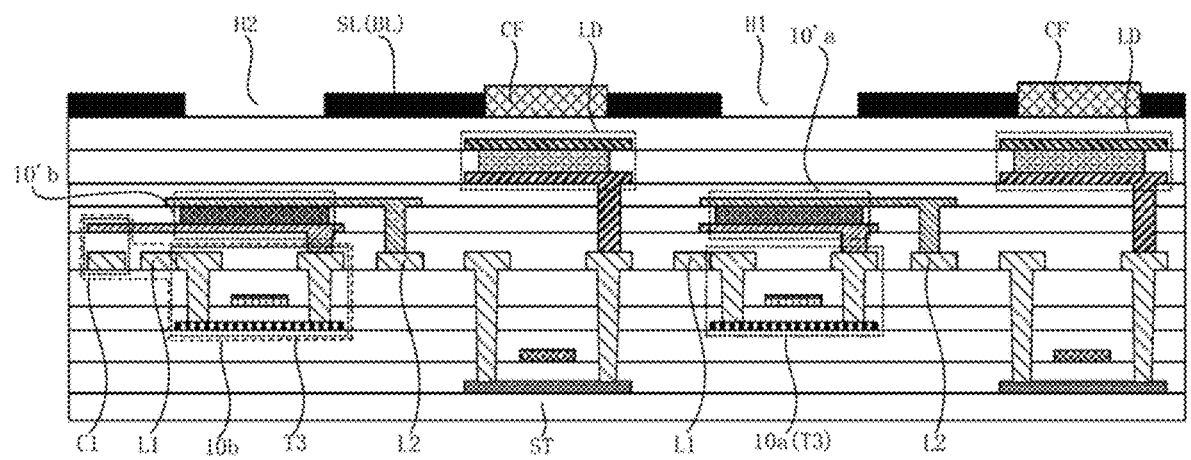
FIG. 21 is a schematic cross-sectional diagram along an L1-L2 direction shown in FIG. 1.

FIG. 21 is a schematic cross-sectional diagram along an L1-L2 direction shown in FIG. 1.

In a technical solution corresponding to this embodiment, as shown in FIG. 21, the display panel 001 includes light-emitting devices LD, a black matrix layer BL, and color filters CF. The black matrix layer BL and the color filter CF are both disposed at a side of a film, on which the light-emitting device LD is located, away from the substrate. The black matrix layer BL includes color filter openings, and along a direction perpendicular to a plane of the display panel 001, the color filter opening overlaps the light-emitting device LD. The color filter CF fills the color filter opening, and a color of the color filter CF filling the color filter opening is the same as a color of light emitted by a light-emitting device LD corresponding to the color filter opening, such that display light rays emitted by the light-emitting device LD change to light rays with purer chrominance after passing through the color filter CF and then emerge from a light exit surface of the display panel 001.

In this technical solution, the black matrix layer BL may be reused for a light-shielding layer SL. That is, the black matrix layer BL may be provided with a first opening H1 and a second opening H2 respectively corresponding to a first light-sensing device 10′a and a second light-sensing device 10′b. In this case, the black matrix layer BL may be used as the light-shielding layer SL in this embodiment of the present disclosure. The black matrix layer BL is reused as the light-shielding layer SL, such that a thickness of the display panel 001 and fabrication process steps and costs of the display panel 001 can be reduced.

Figure 22:
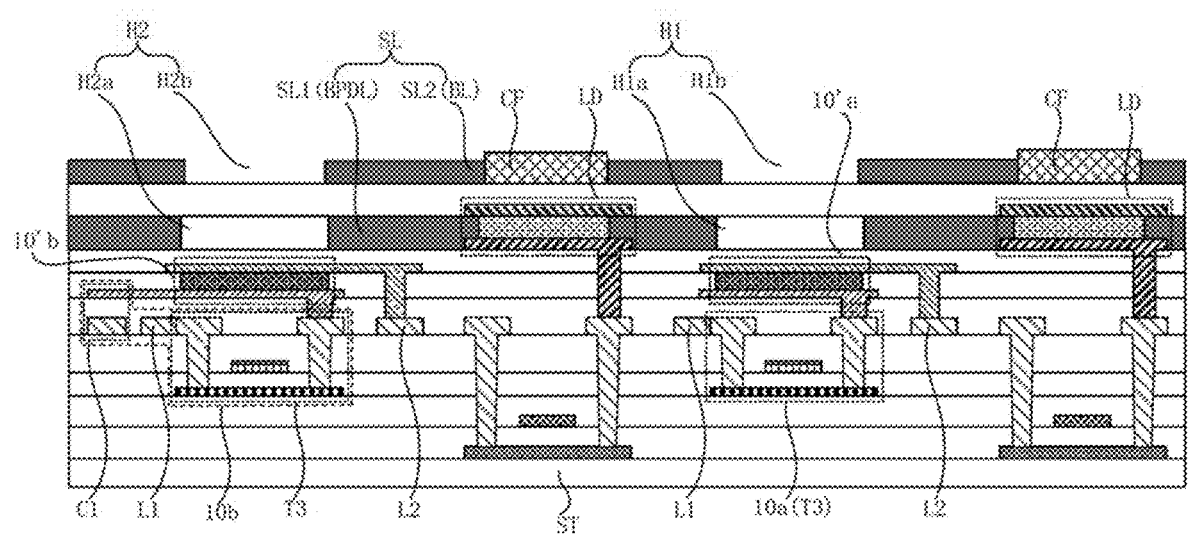
FIG. 22 is a schematic cross-sectional diagram along an L1-L2 direction shown in FIG. 1.

FIG. 22 is a schematic cross-sectional diagram along an L1-L2 direction shown in FIG. 1.

In a technical solution corresponding to this embodiment, as shown in FIG. 22, a light-shielding layer SL includes a first light-shielding sub-layer SL1 and a second light-shielding sub-layer SL2. In addition, a black pixel definition layer BPDL is reused for the first light-shielding sub-layer SL1, and a black matrix layer BL is reused for the second light-shielding sub-layer SL2. Correspondingly, the first opening H1 includes an opening H1a provided in the black pixel definition layer BPDL and an opening H1b provided in the black matrix layer BL, and the opening H1a overlaps the opening H1b along a direction perpendicular to a plane of the display panel 001; the second opening H2 includes an opening H2a provided in the black pixel definition layer BPDL and an opening H2b provided in the black matrix layer BL, and the opening H2a overlaps the opening H2b along the direction perpendicular to the plane of the display panel 001.

Opening areas of the opening H1a and the opening H1b that are included in the first opening H1 may be the same or different; and/or opening areas of the opening H2a and the opening H2b that are included in the second opening H2 may be the same or different.

When the opening areas of the opening H1a and the opening H1b that are included in the first opening H1 are different, the opening area of the opening H1a provided in the first light-shielding sub-layer SL1 may be less than the opening area of the opening H1b provided in the second light-shielding sub-layer SL2. Because the second light-shielding sub-layer SL2 is more close to a light exit surface of the display panel 001 compared with the first light-shielding sub-layer SL1, when the opening area of the opening H1b provided in the second light-shielding sub-layer SL2 is larger, more light signals required by the first light-sensing device 10′a may enter the display panel 001; because the first light-shielding sub-layer SL1 is more close to a film on which the light-emitting device LD is located compared with the second light-shielding sub-layer SL2, when the opening area of the opening H1a provided in the first light-shielding sub-layer SL1 is smaller, impact of light rays emitted by the light-emitting device LD on detection of a light signal performed by the first light-sensing device 10'a can be effectively reduced.

When the opening areas of the opening H2a and the opening H2b that are included in the second opening H2 are different, the opening area of the opening H2a provided in the first light-shielding sub-layer SL1 may be less than the opening area of the opening H2b provided in the second light-shielding sub-layer SL2. Because the second light-shielding sub-layer SL2 is more close to a light exit surface of the display panel 001 compared with the first light-shielding sub-layer SL1, when the opening area of the opening H2b provided in the second light-shielding sub-layer SL2 is larger, more light signals required by the second light-sensing device 10'b may enter the display panel 001; because the first light-shielding sub-layer SL1 is more close to a film on which the light-emitting device LD is located compared with the second light-shielding sub-layer SL2, when the opening area of the opening H2a provided in the first light-shielding sub-layer SL1 is smaller, impact of light rays emitted by the light-emitting device LD on detection of a light signal performed by the second light-sensing device 10'b can be effectively reduced.

Figure 23:
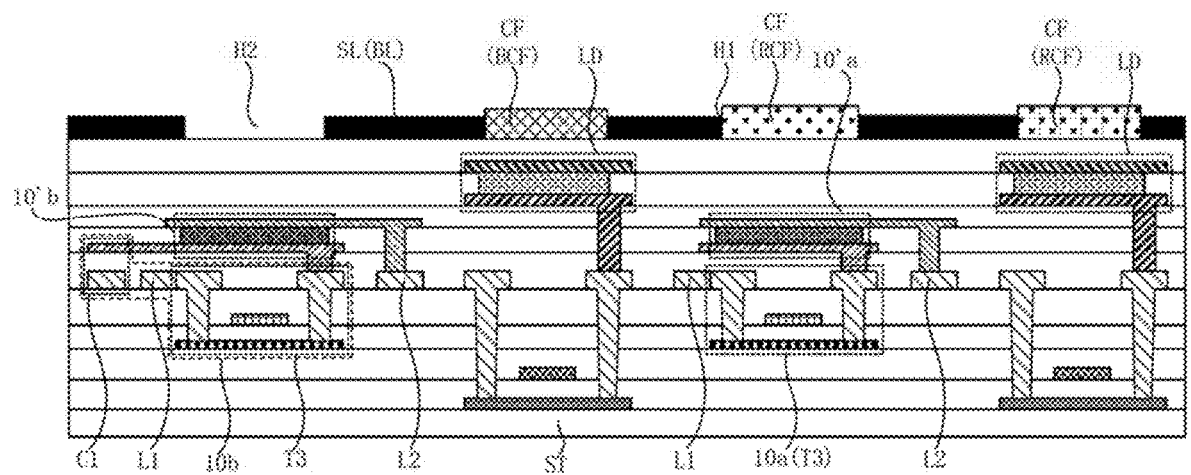
FIG. 23 is a schematic cross-sectional diagram along an L1-L2 direction shown in FIG. 1.

FIG. 23 is a schematic cross-sectional diagram along an L1-L2 direction shown in FIG. 1.

In an embodiment of the present disclosure, as shown in FIG. 23, the display panel 001 includes color filters CF. However, the color filter CF does not fill a second opening H2. That is, a side that is of a second light-sensing device 10'b and that is for receiving a light signal is not provided with the color filter CF. In this case, the second light-sensing device 10'b may receive more ambient light, to improve detection accuracy of the second light-detection circuit 10b.

In a technical solution corresponding to this embodiment, the color filter CF fills a first opening H1. In a first opening H1 and a light-emitting device LD whose orthographic projection is adjacent on the substrate ST, a color of the color filter CF filling the first opening H1 is the same as a color of light emitted by at least one light-emitting device LD. In this case, the color of the color filter filling the first opening H1 is the same as a color of emitted light of at least one sub-pixel adjacent to the first opening H1.

In this embodiment, the black matrix layer BL may be reused for at least part of the light-shielding layer SL, and colors of color filters separately filling the first opening H1 and at least one adjacent color filter opening may be the same. For example, as shown in FIG. 23, a red color filter RCF fills one first opening H1. In this case, the red color filter RCF also fills at least one color filter opening adjacent to the first opening H1. Alternatively, a blue color filter BCF may fill the first opening H1 shown in FIG. 23. Because the blue color filter BCF also fills at least one color filter opening adjacent to the first opening H1, display light rays emitted by the light-emitting device LD below the color filter opening may be reused as detection light rays of light signals detected by the first light-sensing device 10'a. For example, the first-type light-detection unit 01 is configured to perform fingerprint recognition. In this case, detection light rays required in a fingerprint recognition process may originate from display light rays emitted by the light-emitting device LD. Therefore, a color of a light signal received by the first light-sensing device 10'a is the same as colors of detection light rays emitted by at least one adjacent light-emitting device LD. This can ensure detection accuracy of the first-type light-detection unit 01.

Figure 24:
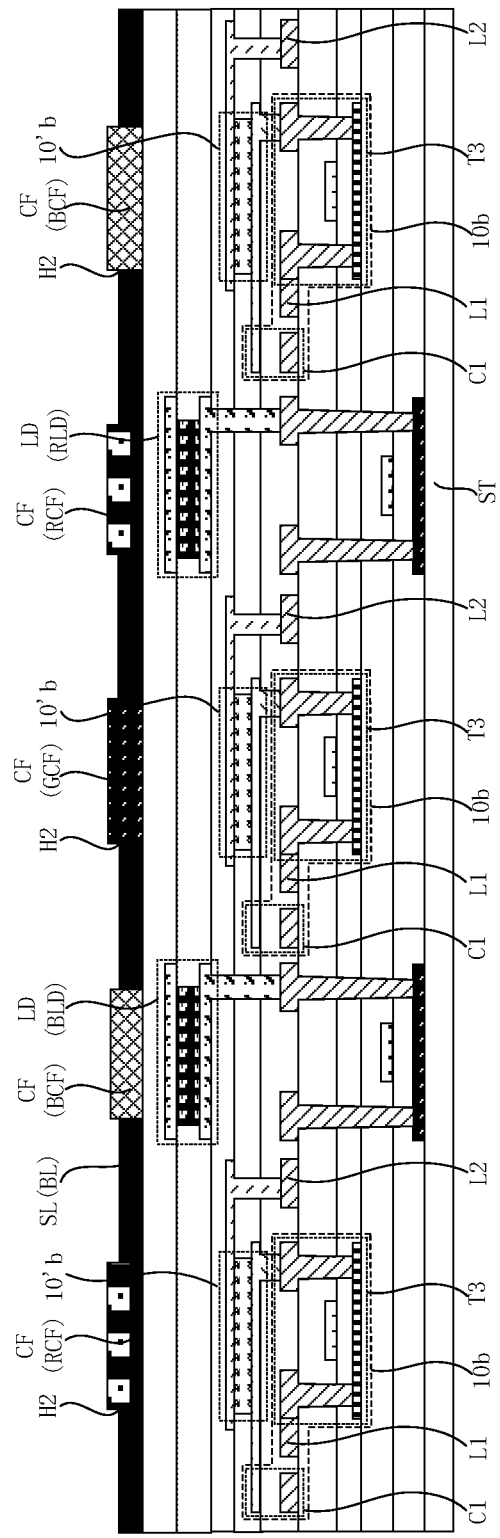
FIG. 24 is a schematic cross-sectional diagram along an N1-N2 direction shown in FIG. 1.
Figure 25:
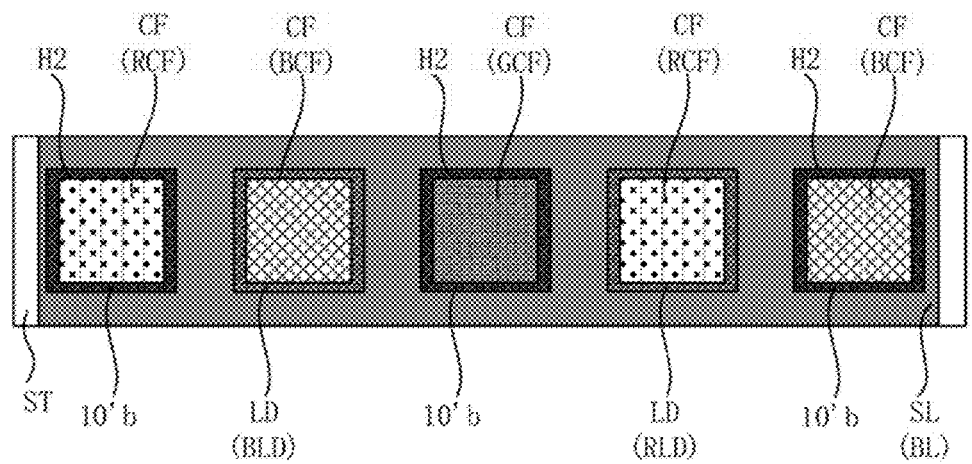
FIG. 25 is a schematic projection diagram of part of a structure in FIG. 24.

FIG. 24 is a schematic cross-sectional diagram along an N1-N2 direction shown in FIG. 1. FIG. 25 is a schematic projection diagram of part of a structure in FIG. 24.

In an embodiment of the present disclosure, as shown in FIG. 24, the display panel 001 further includes color filters CF, and the color filter CF fills a second opening H2. The color filter CF may fill the second opening H2 to achieve detection of a light signal by the display panel 001 in a specific application scenario. For example, when the red color filter RCF fills at least some of second openings H2, second light-sensing devices 10'b that the second openings H2 correspondingly overlap and second light-detection circuits 10b corresponding to the second light-sensing device 10'b may detect red light in an environment, and further determine whether the environment in which the display panel 001 is located has a relatively high temperature.

The color filter CF may or may not fill the first opening H1. When the color filter CF fills the first opening H1, for a specific filling manner, reference may be made to the foregoing embodiment. Details are not described herein again.

In a technical solution corresponding to this embodiment, as shown in FIG. 24, the display panel 001 further includes light-emitting devices LD emitting light of different colors. FIG. 24 shows a blue light-emitting device BLD and a red light-emitting device RLD. In addition, the display panel 001 may further include a green light-emitting device GLD.

With reference to FIG. 24 and FIG. 25, in a second opening H2 and a light-emitting device LD whose orthographic projection is adjacent on the substrate ST, a color of a color filter CF filling the second opening H2 is different from a color of light emitted by the light-emitting device LD. A structure shown in FIG. 24 and FIG. 25 is used as an example for description. Light-emitting devices LD at two sides of a region in which a middle second opening H2 is located are respectively a blue light-emitting device BLD and a red light-emitting device RLD. In this case, a color filter CF filling the middle second opening H2 is a green color filter GCF. In this case, display blue light rays emitted by the blue light-emitting device BLD and display red light rays emitted by the red light-emitting device RLD are blocked by the green color filter GCF, and further not incident to the second light-sensing device 10'b below the second opening H2. Therefore, this technical solution can effectively avoid interference of light rays emitted by the light-emitting device LD to detection of a light signal by the second-type light-detection unit 02, and for example, may avoid interference of the light rays emitted by the light-emitting device LD to detection of ambient light.

In an embodiment of the present disclosure, as shown in FIG. 24, colors of color filters CF filling at least two of second openings H2 are different. For example, FIG. 24 shows three second openings H2 and a red color filter RCF, a green color filter GCF, and a blue color filter BCF separately fill the three second openings H2.

Figure 26:
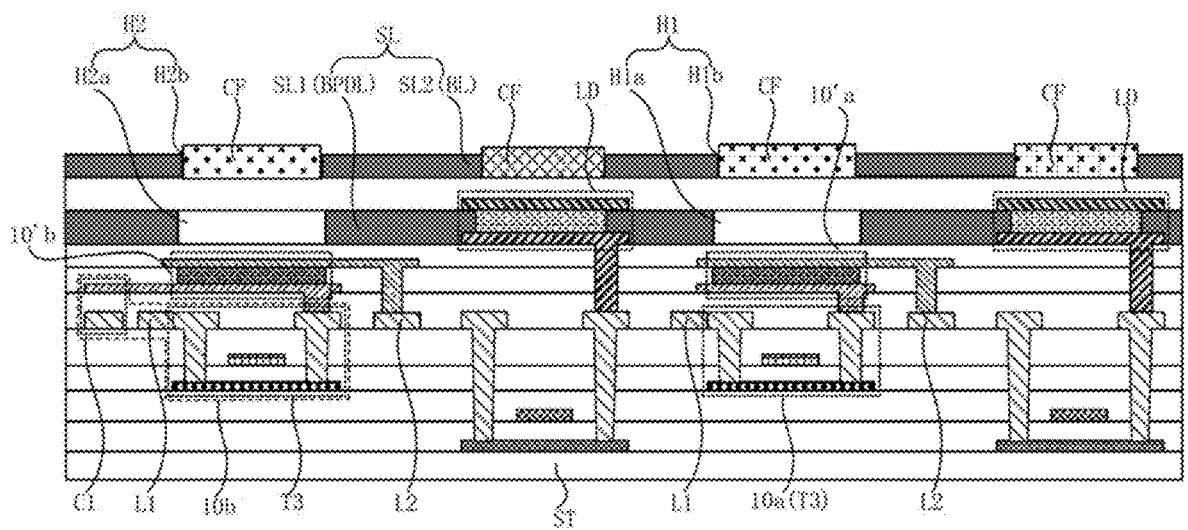
FIG. 26 is a schematic cross-sectional diagram along an N1-N2 direction shown in FIG. 1.

FIG. 26 is a schematic cross-sectional diagram along an N1-N2 direction shown in FIG. 1.

It should be noted that, when a black pixel definition layer BPDL is reused for a first light-shielding sub-layer SL1 of a light-shielding layer SL and a black matrix layer BL is reused for a second light-shielding sub-layer SL2, a first opening H1 includes an opening H1a and an opening H1b that overlap along a direction perpendicular to a plane of the display panel 001 and that are respectively provided in the first light-shielding sub-layer SL1 and the second light-shielding sub-layer SL2, and the second opening H2 includes an opening H2a and an opening H2b that overlap along the direction perpendicular to the plane of the display panel 001 and that are respectively provided in the first light-shielding sub-layer SL1 and the second light-shielding sub-layer SL2. Correspondingly, when the color filter CF fills at least some of first openings H1 and/or at least some of second openings H2, as shown in FIG. 26, the color filter CF may fill at least some of openings H1b and/or at least some of openings H2b that are/is provided in the second light-shielding sub-layer SL2, without filling the opening H1a and/or the opening H2a that are/is provided in the first light-shielding sub-layer SL1.

Figure 27:
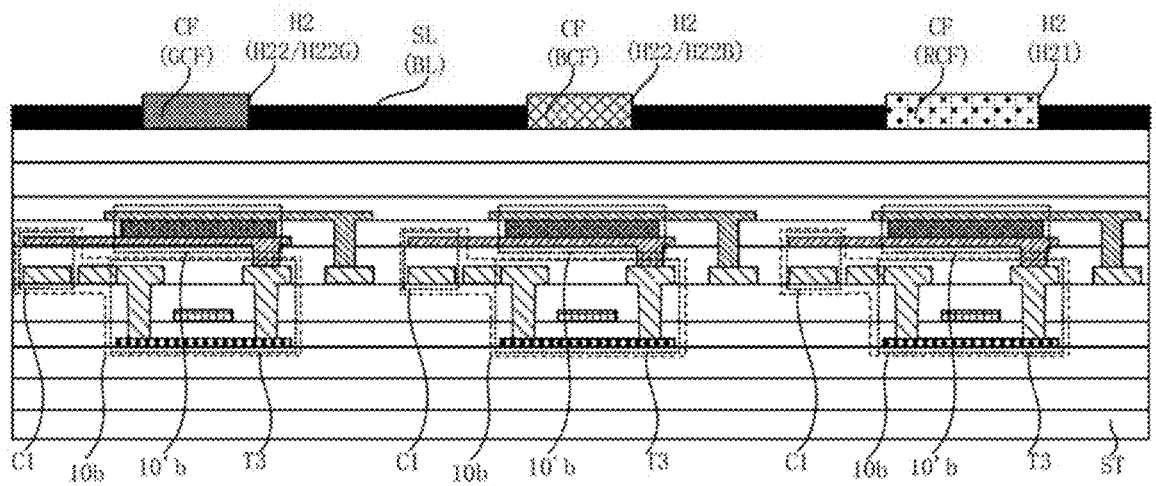
FIG. 27 is a schematic cross-sectional diagram along an N1-N2 direction shown in FIG. 1.
Figure 28:
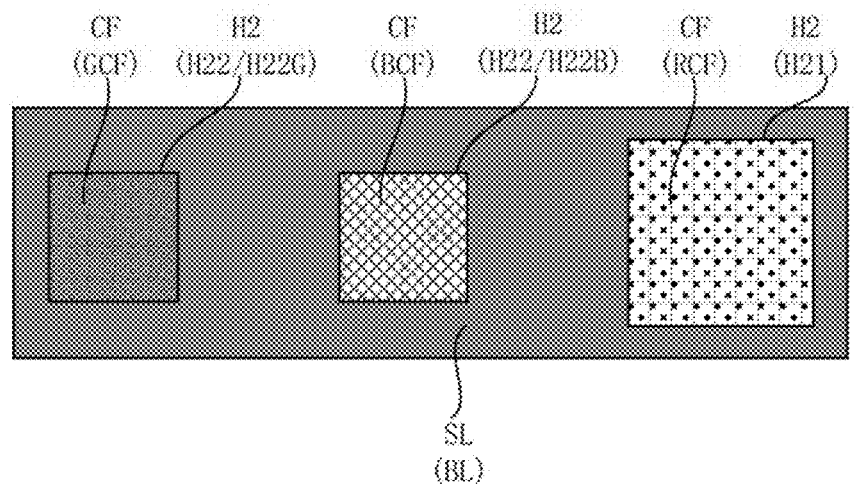
FIG. 28 is a schematic plane diagram of a light-shielding layer in FIG. 27.

FIG. 27 is a schematic cross-sectional diagram along an N1-N2 direction shown in FIG. 1. FIG. 28 is a schematic plane diagram of a light-shielding layer in FIG. 27.

In an embodiment of the present disclosure, as shown in FIG. 27 and FIG. 28, second openings H2 include a first sub-opening H21 and a second sub-opening H22. A color of a color filter CF filling the first sub-opening H21 is different from a color of a color filter CF filling the second sub-opening H22, and an opening area of the first sub-opening H21 is different from an opening area of the second sub-opening H22.

In a technical solution, a red color filter RCF fills the first sub-opening H21, and a green color filter GCF or a blue color filter BCF fills the second sub-opening H22. In addition, the opening area of the first sub-opening H21 is greater than the opening area of the second sub-opening H22. That is, an opening area of a second opening H2 that the red color filter RCF fills is greater than an area of a second opening H2 that the green color filter GCF fills, and/or an opening area of a second opening H2 that the red color filter RCF fills is greater than an area of a second opening H2 that the blue color filter BCF fills.

In an implementation, as shown in FIG. 27 and FIG. 28, the red color filter RCF fills the first sub-opening H21 and the green color filter GCF fills at least some of second sub-openings H22, and an opening area of the first sub-opening H21 is greater than an opening area of the at least some of second sub-openings H22. That is, the opening area of the second opening H2 that the red color filter RCF fills is greater than the area of the second opening H2 that the green color filter GCF fills.

When a second light-sensing device 10'b is a photodiode, sensitivity of a photodiode configured to detect green light is higher than sensitivity of a photodiode configured to detect red light. The opening area of the second opening H2 that the red color filter RCF fills is provided to be larger, that is, a light amount of light signals received by a second light-sensing device 10'b configured to detect the red light in unit time is increased, to balance between detection sensitivity of the second light-sensing device 10'b configured to detect the red light and detection sensitivity of a second light-sensing device 10'b configured to detect the green light.

In an implementation, as shown in FIG. 27 and FIG. 28, the red color filter RCF fills the first sub-opening H21 and the blue color filter BCF fills at least some of second sub-openings H22, and an opening area of the first sub-opening H21 is greater than an opening area of the at least some of second sub-openings H22. That is, the opening area of the second opening H2 that the red color filter RCF fills is greater than the area of the second opening H2 that the blue color filter BCF fills.

When a second light-sensing device 10'b is a photodiode, sensitivity of a photodiode configured to detect blue light is higher than sensitivity of a photodiode configured to detect red light. The opening area of the second opening H2 that the red color filter RCF fills is provided to be larger, that is, a light amount of light signals received by a second light-sensing device 10'b configured to detect the red light in unit time is increased, to balance between detection sensitivity of a second-type light-detection unit 02 configured to detect the red light and detection sensitivity of a second-type light-detection unit configured to detect the blue light.

In an implementation, as shown in FIG. 27 and FIG. 28, the red color filter RCF fills the first sub-opening H21, the green color filter GCF fills some of second sub-openings H22, and the blue color filter BCF fills some of the second sub-openings H22. The opening area of the first sub-opening H21 is greater than an opening area of the second sub-opening H22 that the green color filter GCF fills and is greater than an opening area of the second sub-opening H22 that the blue color filter BCF fills. The opening area of the second sub-opening H22 that the green color filter GCF fills and the opening area of the second sub-opening H22 that the blue color filter BCF fills may or may not be the same.

Figure 29:
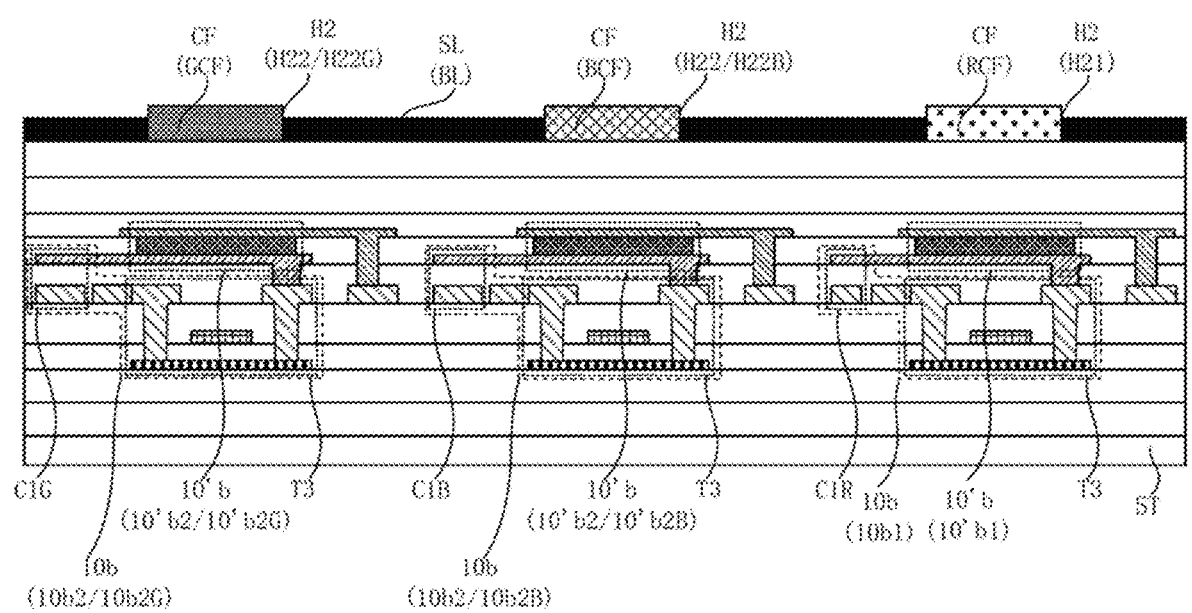
FIG. 29 is a schematic cross-sectional diagram along an N1-N2 direction shown in FIG. 1.

FIG. 29 is a schematic cross-sectional diagram along an N1-N2 direction shown in FIG. 1.

In an embodiment of the present disclosure, as shown in FIG. 29, second openings H2 include a first sub-opening H21 and a second sub-opening H22, second light-sensing devices 10'b include a first light-sensing sub-apparatus 10'b1 and a second light-sensing sub-apparatus 10'b2, and second light-detection circuits 10b include a first light-detection sub-circuit 10b1 and a second light-detection sub-circuit 10b2. Along a direction perpendicular to a plane of the display panel 001, the first light-sensing sub-apparatus 10'b1 at least partially overlaps the first sub-opening H21 and the second light-sensing sub-apparatus 10'b2 overlaps the second sub-opening H22; the first light-detection sub-circuit 10b1 is electrically connected to the first light-sensing sub-apparatus 10'b 1, and the second light-detection sub-circuit 10b2 is electrically connected to the second light-sensing sub-apparatus 10'b2.

A color of a color filter CF filling the first sub-opening H21 is different from a color of a color filter filling the second sub-opening H22, and a capacitance of a first capacitor C1 in the first light-detection sub-circuit 10b1 is not equal to a capacitance of a first capacitor C1 in the second light-detection sub-circuit 10b2.

In a technical solution, a red color filter RCF fills the first sub-opening H21, and a green color filter GCF or a blue color filter BCF fills the second sub-opening H22. In addition, the capacitance of the first capacitor C1 in the first light-detection sub-circuit 10b1 is less than the capacitance of the first capacitor C1 in the second light-detection sub-circuit 10b2. That is, a capacitance of a first capacitor C1R in a second light-detection circuit 10b configured to detect red light is less than a capacitance of a first capacitor C1G in a second light-detection circuit 10b configured to detect green light, and/or the capacitance of the first capacitor C1R in the second light-detection circuit 10b configured to detect the red light is less than a capacitance of a first capacitor C1B in a second light-detection circuit 10b configured to detect blue light.

In an implementation, as shown in FIG. 29, the red color filter RCF fills the first sub-opening H21, and the green color filter GCF fills at least some of the second sub-openings H22. The capacitance of the first capacitor C1 in the first light-detection sub-circuit 10b1 is less than capacitances of first capacitors C1 in second light-detection sub-circuits 10b2 corresponding to the second sub-openings H22. Specifically, as shown in FIG. 28, the red color filter RCF fills the first sub-opening H21, and the green color filter GCF fills a second sub-opening H22G. The second sub-opening H22G exposes a second light-sensing sub-apparatus 10'b2G. A capacitance of a first capacitor C1G in a second light-detection sub-circuit 10b2G electrically connected to a second light-sensing sub-apparatus 10'b2G is greater than a capacitance of a first capacitor C1R in the first light-detection sub-circuit 10b1.

In this implementation, the capacitance of the first capacitor C1R in the second light-detection circuit 10b configured to detect the red light is less than the capacitance of the first capacitor C1G in the second light-detection circuit 10b configured to detect the green light. In this case, sensitivity of the second light-detection circuit 10b configured to detect the red light is higher than sensitivity of the second light-detection circuit 10b configured to detect the green light, to balance between sensitivity of a second-type light-detection unit 02 configured to detect the red light and sensitivity of a second-type light-detection unit 02 configured to detect the green light.

In an implementation, as shown in FIG. 29, the red color filter RCF fills the first sub-opening H21, and the blue color filter BCF fills at least some of second sub-openings H22. The capacitance of the first capacitor C1 in the first light-detection sub-circuit 10b1 is less than capacitances of first capacitors C1 in third light-detection sub-circuits 10b2 corresponding to the second sub-openings H22. Specifically, as shown in FIG. 28, the red color filter RCF fills the first sub-opening H21, and the blue color filter BCF fills a second sub-opening H22B. The second sub-opening H22B exposes a second light-sensing sub-apparatus 10'b2B. A capacitance of a first capacitor C1B in a second light-detection sub-circuit 10b2B electrically connected to a second light-sensing sub-apparatus 10'b2B is greater than a capacitance of a first capacitor C1R in the first light-detection sub-circuit 10b1.

In this implementation, the capacitance of the first capacitor C1R in the second light-detection circuit 10b configured to detect the red light is less than the capacitance of the first capacitor C1B in the second light-detection circuit 10b configured to detect the blue light. In this case, sensitivity of the second light-detection circuit 10b configured to detect the red light is higher than the second light-detection circuit 10b configured to detect the blue light, to balance between a second-type light-detection unit 02 configured to detect the red light and a second-type light-detection unit 02 configured to detect the blue light.

In an implementation, as shown in FIG. 29, the red color filter RCF fills the first sub-opening H21, the green color filter GCF fills some of second sub-openings H22, and the blue color filter BCF fills some of the second sub-openings H22. In this case, the capacitance of the first capacitor C1R in the first light-detection sub-circuit 10b1 is less than the capacitance of the first capacitor C1G in the second light-detection sub-circuit 10b2 configured to detect the green light, and the capacitance of the first capacitor C1R in the first light-detection sub-circuit 10b1 is less than the capacitance of the first capacitor C1B in the second light-detection sub-circuit 10b2 configured to detect the blue light. Specifically, as shown in FIG. 28, the red color filter RCF fills the first sub-opening H21, the green color filter GCF fills the second sub-opening H22G, and the blue color filter BCF fills the second sub-opening H22B. The second sub-opening H22G exposes the second light-sensing sub-apparatus 10'b2G, and the second sub-opening H22B exposes the second light-sensing sub-apparatus 10'b2B. The capacitance of the first capacitor C1G in the second light-detection sub-circuit 10b2G electrically connected to the second light-sensing sub-apparatus 10'b2G is greater than the capacitance of the first capacitor C1R in the first light-detection sub-circuit 10b1, and the capacitance of the first capacitor C1B in the second light-detection sub-circuit 10b2B electrically connected to the second light-sensing sub-apparatus 10'b2B is greater than the capacitance of the first capacitor C1R in the first light-detection sub-circuit 10b1.

Figure 30:
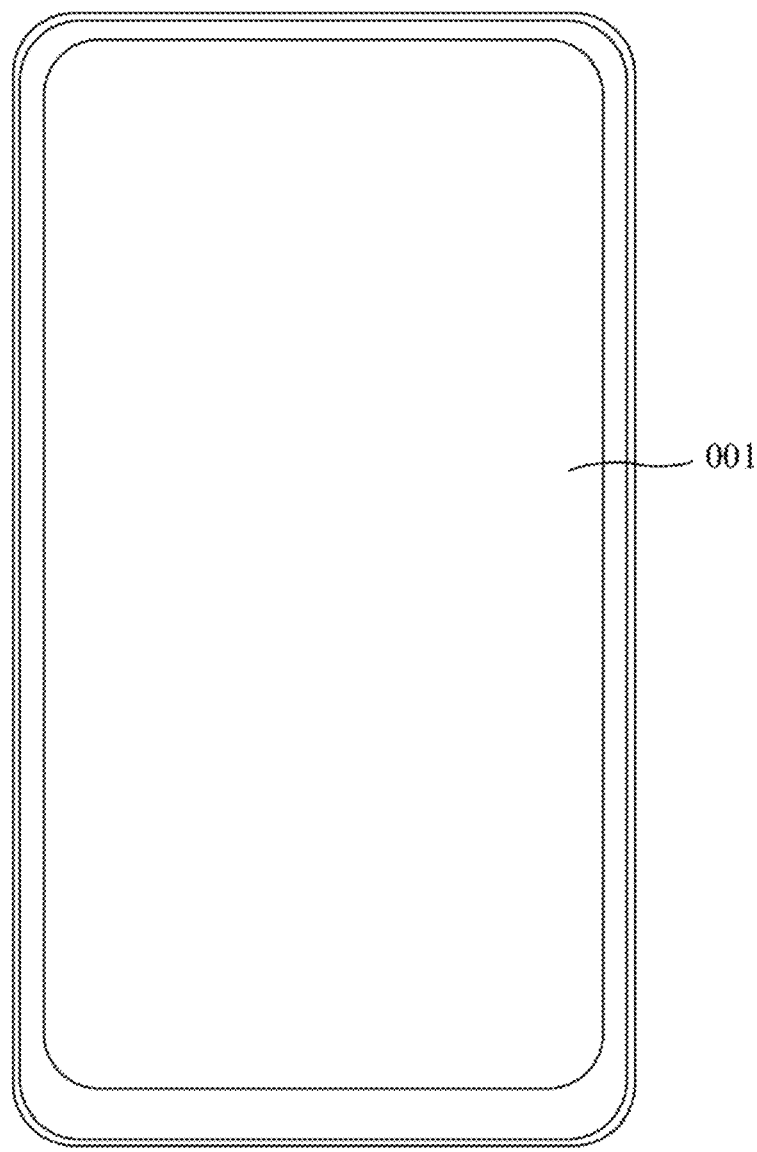
FIG. 30 is a schematic diagram of a display device according to an embodiment of the present disclosure.

FIG. 30 is a schematic diagram of a display device according to an embodiment of the present disclosure.

As shown in FIG. 30, a display device is provided in an embodiment of the present disclosure, including the display panel 001 according to any one of the foregoing embodiments. For example, the display devices may be an electronic device such as a mobile phone, a computer, an intelligent wearable device (for example, a smart watch), and an in-vehicle display device. This is not limited in the embodiments of the present disclosure.

In the display devices provided in the embodiments of the present disclosure, the first capacitor C1 is added in the control terminal CTR of the sensing module 22 in the second light-detection circuit 10b, such that the load capacitance of the control terminal CTR of the sensing module 22 is increased. Therefore, the second-type light-detection unit 02 may begin to work when a light signal received and detected by the second-type light-detection unit 02 is relatively large. This reduces impact of display light rays emitted by the display devices on the light signal that needs to be detected by the second-type light-detection unit 02, and improves accuracy of detection performed by the second-type light-detection unit 02 on the light signal.

The above descriptions are merely preferred embodiments of the present disclosure and are not intended to limit the present disclosure. Any modification, equivalent replacement and improvement within the spirit and principle of the present disclosure shall be included within the protection scope of the present disclosure.

What is claimed is:

1. A display panel, comprising:
a substrate;
a light-sensing device, disposed at a side of the substrate; and
a light-detection circuit comprising a sensing module, a reading module and a resetting module, wherein the sensing module comprises a control terminal electrically connected to the light-sensing device and the resetting module, an input terminal electrically connected to a first signal line, and an output terminal electrically connected to the reading module,
wherein the light-sensing device comprises a first light-sensing device and a second light-sensing device, the light-detection circuit comprises a first light-detection circuit and a second light-detection circuit, the first light-sensing device is electrically connected to the control terminal of the sensing module in the first light-detection circuit, and the second light-sensing device is electrically connected to the control terminal of the sensing module in the second light-detection circuit; and
the second light-detection circuit further comprises a first capacitor, wherein the first capacitor is electrically connected to the control terminal of the sensing module in the second light-detection circuit;
wherein the first capacitor has a first plate electrically connected to the control terminal of the sensing module in the second light-detection circuit, and a second plate electrically connected to the first signal line; and wherein the second plate and the first signal line are disposed in a same layer.

2. The display panel according to claim 1, wherein the control terminal of the sensing module in the first light-detection circuit has a capacitive load less than a capacitive load of the control terminal of the sensing module in the second light-detection circuit.

3. The display panel according to claim 1, further comprising a light-shielding layer disposed at a side of the light-sensing device adjacent to a light exit surface of the display panel, wherein the light-shielding layer comprises a first opening and a second opening, wherein along a direction perpendicular to a plane of the display panel, the first opening at least partially overlaps the first light-sensing device and the second opening at least partially overlaps the second light-sensing device.

4. The display panel according to claim 3, wherein the second opening has an opening area greater than an opening area of the first opening, and/or
wherein the display panel further comprises color filters, and at least one color filter of the color filters fills the first opening, and each additional color filter of the color filters does not fill the second opening.

5. The display panel according to claim 3, further comprising color filters, wherein at least one color filter of the color filters fills the second opening.

6. The display panel according to claim 5, further comprising light-emitting devices configured to emit light of different colors, wherein, in the second opening, one light emitting device of the light-emitting devices has orthographic projections on the substrate, wherein the orthographic projections are adjacent to each other, and
a color of the at least one color filter of the color filters filling the second opening is different from a color of light emitted by a corresponding light-emitting device of the light emitting devices.

7. The display panel according to claim 5, wherein the display panel further comprises at least two second openings,
one or more color filters of the color filters fill the at least two second openings, and
colors of the one or more color filters filling the at least two second openings are different from one another.

8. The display panel according to claim 7, wherein the at least two second openings comprise a first sub-opening and a second sub-opening,
wherein a red color filter fills the first sub-opening, a green color filter or a blue color filter fills the second sub-opening, and the opening area of the first sub-opening is greater than the opening area of the second sub-opening.

9. The display panel according to claim 7, wherein the at least two second openings comprise a first sub-opening and a second sub-opening,
wherein a color of one color filter of the color filters filling the first sub-opening is different from a color of another color filter of the color filters filling the second sub-opening;
the second light-sensing device comprises a first light-sensing sub-apparatus and a second light-sensing sub-apparatus, wherein along the direction perpendicular to the plane of the display panel, the first light-sensing sub-apparatus at least partially overlaps the first sub-opening, and the second light-sensing sub-apparatus overlaps the second sub-opening;

the second light-detection circuit comprises a first light-detection sub-circuit and a second light-detection sub-circuit,
wherein the first light-detection sub-circuit is electrically connected to the first light-sensing sub-apparatus, and the second light-detection sub-circuit is electrically connected to the second light-sensing sub-apparatus, and
wherein the first capacitor in the first light-detection sub-circuit has a capacitance not equal to a capacitance of the first capacitor in the second light-detection sub-circuit.

10. The display panel according to claim 9, wherein a red color filter fills the first sub-opening, and a green color filter or a blue color filter fills the second sub-opening, and
wherein the capacitance of the first capacitor in the first light-detection sub-circuit is less than the capacitance of the first capacitor in the second light-detection sub-circuit.

11. The display panel according to claim 1, wherein the reading module comprises a first transistor; and
the first transistor in at least one second light-detection circuit shares a scanning line with the first transistor in at least part of first light-detection circuit.

12. The display panel according to claim 1, wherein the reading module comprises a first transistor; and
the first transistor in at least part of the second light-detection circuit and the first transistor in the first light-detection circuit are separately connected to different scanning lines.

13. The display panel according to claim 12, wherein the display panel comprises a first shift register circuit and a second shift register circuit,
wherein the first shift register circuit comprises first shift registers that are cascaded, and the second shift register circuit comprises second shift registers that are cascaded; and
the scanning line electrically connected to the one first transistor in the first light-detection circuit is electrically connected to one first shift register in the first shift register circuit, and the scanning line electrically connected to the another first transistor in the second light-detection circuit is electrically connected to one second shift register in the second shift register circuit; or
wherein the scanning line electrically connected to the first transistor in the second light-detection circuit is electrically connected to a drive chip.

14. The display panel according to claim 12, wherein an enabling signal received by the scanning line electrically connected to the one first transistor in the first light-detection circuit has a frequency f1, and an enabling signal received by the scanning line electrically connected to the another first transistor in the second light-detection circuit has a frequency f2, wherein f2<f1.

15. The display panel according to claim 1, wherein the display panel is provided with second light-detection circuits, and capacitances of first capacitors respectively located in at least two second light-detection circuits of the second light-detection circuits are different from one another.

16. The display panel according to claim 1, wherein the sensing module comprises a second transistor,
wherein a gate of the second transistor is electrically connected to the light-sensing device and the resetting module; and the second transistor comprises a metal oxide semiconductor layer.

17. The display panel according to claim 1, wherein the first light-sensing device and the second light-sensing device are each a photodiode,
   wherein the photodiode has a first electrode electrically connected to a second signal line, and a second electrode electrically connected to the control terminal of the sensing module,
   wherein the first plate and the second electrode of the photodiode are disposed at a same layer, and/or the second plate and the second signal line are disposed in a same layer.

18. A display apparatus, comprising:
   a display panel, wherein the display panel comprises:
   a substrate;
   a light-sensing device, disposed at a side of the substrate; and
   a light-detection circuit, comprising a sensing module, a reading module and a resetting module, wherein the sensing module comprises a control terminal electrically connected to the light-sensing device and the resetting module, an input terminal electrically connected to a first signal line, and an output terminal electrically connected to the reading module,
   wherein the light-sensing device comprises a first light-sensing device and a second light-sensing device, the light-detection circuit comprises a first light-detection circuit and a second light-detection circuit, the first light-sensing device is electrically connected to the control terminal of the sensing module in the first light-detection circuit, and the second light-sensing device is electrically connected to the control terminal of the sensing module in the second light-detection circuit; and
   the second light-detection circuit further comprises a first capacitor, wherein the first capacitor is electrically connected to the control terminal of the sensing module in the second light-detection circuit;
   wherein the first capacitor has a first plate electrically connected to the control terminal of the sensing module in the second light-detection circuit, and a second plate electrically connected to the first signal line; and
   wherein the second plate and the first signal line are disposed in a same layer.

* * * * *